United States Patent
Fujimoto et al.

(10) Patent No.: US 10,812,036 B2
(45) Date of Patent: Oct. 20, 2020

(54) MATCHING BOX AND MATCHING METHOD

(71) Applicant: Hitachi Kokusai Electric Inc., Tokyo (JP)

(72) Inventors: Naoya Fujimoto, Tokyo (JP); Norikazu Kato, Tokyo (JP); Yoshiyuki Oshida, Tokyo (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 59 days.

(21) Appl. No.: 15/736,793

(22) PCT Filed: Jun. 30, 2015

(86) PCT No.: PCT/JP2015/068820
§ 371 (c)(1),
(2) Date: Dec. 15, 2017

(87) PCT Pub. No.: WO2017/002196
PCT Pub. Date: Jan. 5, 2017

(65) Prior Publication Data
US 2018/0191324 A1    Jul. 5, 2018

(51) Int. Cl.
*H03H 7/40*     (2006.01)
*H01J 37/32*    (2006.01)
(Continued)

(52) U.S. Cl.
CPC ......... *H03H 7/40* (2013.01); *H01J 37/32183* (2013.01); *H01P 5/18* (2013.01);
(Continued)

(58) Field of Classification Search
CPC ..... H03H 7/40; H03H 7/383; H01J 37/32183; H01P 5/18
See application file for complete search history.

(56) References Cited

U.S. PATENT DOCUMENTS

| | | |
|---|---|---|
| 2015/0236728 A1 | 8/2015 | Suzuki |
| 2016/0352302 A1 | 12/2016 | Nakamura et al. |
| 2018/0115298 A1 | 4/2018 | Fujimoto et al. |

FOREIGN PATENT DOCUMENTS

| | | |
|---|---|---|
| JP | 05-063604 A | 3/1993 |
| JP | 2010-045664 A | 2/2010 |

(Continued)

OTHER PUBLICATIONS

Japanese Office Action received in corresponding Japanese Application No. 2017-525720 dated Oct. 2, 2018.
(Continued)

*Primary Examiner* — Samuel S Outten
(74) *Attorney, Agent, or Firm* — Mattingly & Malur, PC

(57) ABSTRACT

A matching box comprises a directional coupler that detects forward waves and reflected waves; a matching circuit having a first variable capacitance capacitor, a second variable capacitance capacitor, and inductance; and a control unit that calculates a reflection coefficient on the basis of the forward waves and the reflected waves, and controls a capacitance value VC1 of the first variable capacitance capacitor and a capacitance value VC2 of the second variable capacitance capacitor, wherein the control unit changes VC2 if the distance between a matching circle drawn by the trajectory of the reflection coefficient passing through a matching point on a Smith chart, and the calculated reflection coefficient is greater than a prescribed value, and changes VC1 if such distance is set to be no greater than the prescribed value and when the value of such distance becomes no greater than the prescribed value, thereby reducing the reflection coefficient.

3 Claims, 14 Drawing Sheets

(51) Int. Cl.
*H01P 5/18* (2006.01)
*H03H 7/38* (2006.01)
*H05H 1/46* (2006.01)

(52) U.S. Cl.
CPC ........ *H03H 7/383* (2013.01); *H01J 2237/332* (2013.01); *H01J 2237/334* (2013.01); *H05H 2001/4682* (2013.01)

(56) References Cited

FOREIGN PATENT DOCUMENTS

| | | | |
|---|---|---|---|
| JP | 2014-241724 A | 12/2014 | |
| JP | WO2015/129678 A1 | 9/2015 | |
| JP | WO2016/136444 A1 | 9/2016 | |
| WO | 2013/132591 A1 | 9/2013 | |
| WO | 2014/037994 A1 | 3/2014 | |

OTHER PUBLICATIONS

International Search Report of PCT/JP2015/068820 dated Sep. 15, 2015.
Korean Office Action received in corresponding Korean Application No. 10-2017-7036745 dated Mar. 20, 2019.

MATCHING BOX AND MATCHING METHOD

TECHNICAL FIELD

The present invention relates to a matching box that matches an output of a RF (Radio Frequency) Generator with a load.

BACKGROUND ART

In a plasma processing device is used in a semiconductor manufacturing process for performing etching and thin film formation. A RF Generator is used as a power supply source of the plasma processing device. In order to efficiently supply an electric power from the RF Generator to the plasma processing device, there is a need to match an impedance between the RF Generator and the plasma processing device (load). As means for matching the impedance, for example, as disclosed in Patent Literature 1, a method of inserting a matching box between the RF Generator and the plasma processing device is general.

FIG. 7 is a functional block diagram of a matching box 100 in the background art. In FIG. 7, the matching box 100 is inserted between a RF Generator 2 and a plasma processing device 3. A RF power output from the RF Generator 2 is supplied to the plasma processing device 3 through the matching box 100 to generate plasma in the plasma processing device 3. In order to efficiently supply an electric power from the RF Generator 2 to the plasma processing device 3, there is a need to match the impedance between the RF Generator 2 and the plasma processing device 3. Since an output impedance of the RF Generator 2 is usually 50Ω, an input impedance of the plasma processing device 3 may be converted by the matching box 100 to set an input impedance of the matching box 100 to 50Ω.

The input impedance of the plasma processing device 3 varies depending on the type, a flow rate, a pressure, a temperature, or the like of a gas to be input into the plasma processing device 3. Therefore, the matching box 100 is required to adaptively match the impedance according to the input impedance of the plasma processing device 3 which is varied with time.

In FIG. 7, the matching box 100 includes a directional coupler 11 that detects a forward wave and a reflected wave, a matching circuit 30 that has a matching element which matches an impedance between the RF Generator 2 and the plasma processing device 3, and a control unit 120 for controlling a circuit constant of the matching element of the matching circuit 30.

The operation of the directional coupler 11 will be described.

A RF power (forward wave: Pf) transmitting from an RFin terminal toward an RFout terminal is detected by the directional coupler 11 and output to a FORWARD terminal. A RF power (reflected wave: Pr) transmitting from the Rf out terminal toward the Rfin terminal is detected by the directional coupler 11 and is output to a REFLECT terminal. Further, the RF power Pf transmitting from the RF in terminal toward the RFout terminal is not detected by the REFLECT terminal, and even if the high frequency power Pf is detected, the detection is slight. Similarly, the high frequency power Pr transmitting from the Rf out terminal toward the RFin terminal is not detected by the FORWARD terminal, and even if the high frequency power Pr is detected, the detection is slight.

The forward wave Pf and the reflected wave Pr detected by the directional coupler 11 are input to a reflection coefficient calculation unit 21 of the control unit 120. A reflection coefficient Γ is defined by the following (Ex. 1) based on an amplitude ratio r and a phase difference θ of the reflected wave Pr to the forward wave Pf.

$$\Gamma = r \cdot \exp(j \cdot \theta) \quad (j: \text{imaginary unit}) \quad \text{(Ex. 1)}$$

Therefore, if the amplitude ratio r and the phase difference θ of the reflected wave Pr to the forward wave Pf are known, the reflection coefficient Γ can be obtained. In the reflection coefficient calculation unit 21, the amplitude ratio r and the phase difference θ are calculated based on the forward wave Pf and the reflected wave Pr to calculate the reflection coefficient Γ. As a specific method, the forward wave Pf and the reflected wave Pr are transformed into frequency domains by FFT (Fast Fourier Transform), and the amplitudes and the phases of the forward wave Pf and the reflected wave Pr may be compared with each other to calculate the amplitude ratio r and the phase difference θ at the same frequency as that of the RF power output by the RF Generator 2.

A capacitance calculation unit 122 calculates a capacitor capacitance for bringing the reflection coefficient close to zero based on the reflection coefficient Γ calculated by the reflection coefficient calculation unit 21. A method of calculating the capacitor capacitance will be described later. A capacitance setting unit 23 sets and changes the capacitance of a variable capacitance capacitor in the matching circuit 30 based on the capacitance of a capacitor calculated by the capacitance calculation unit 122.

FIG. 2 is a configuration diagram of the matching circuit 30. The circuit configuration of the matching circuit 30 depends on a range in which the input impedance of the plasma processing device 3 serving as a load fluctuates, but in this example, a π-type matching circuit will be described. The matching circuit 30 is configured to include a variable capacitance capacitor 31, a variable capacitance capacitor 32, an inductance 33, a transmission line 35, and a transmission line 36. The transmission line 35 and the transmission line 36 can be each formed of a coaxial cable, a metal plate, or the like, and can also be each configured to include a lumped constant circuit of an inductor and a capacitor.

The transmission line 35 connects an input terminal 30a of the matching circuit 30 to one end of the variable capacitance capacitor 31. The other end of the variable capacitance capacitor 31 is grounded. The transmission line 36 connects an output terminal 30b of the matching circuit 30 to one end of the variable capacitance capacitor 32. The other end of the variable capacitance capacitor 32 is grounded.

The variable capacitance capacitor 31, the variable capacitance capacitor 32, and the inductance 33 are matching elements for performing an impedance matching between the RF Generator 2 and the plasma processing device 3. The matching circuit 30 includes a variable capacitance capacitor control terminal 31a for controlling the capacitance of the variable capacitance capacitor 31 and a variable capacitance capacitor control terminal 32a for controlling the capacitance of the variable capacitance capacitor 32.

The variable capacitance capacitor of the matching circuit 30 is controlled so that a magnitude of the reflection coefficient Γ that is calculated according to the forward wave Pf and the reflected wave Pr detected by the directional coupler 11 approaches zero. Calculation formulas of the variable capacitance in this case are expressed by (Ex. 2) and (Ex. 3).

VC1 is a capacitance of the variable capacitance capacitor 31 and VC2 is a capacitance of the variable capacitance capacitor 32.

$$VC1(n)=VC1(n-1)+\text{reat}(\Gamma(n))*S1 \quad \text{(Ex. 2)}$$

$$VC2(n)=VC2(n-1)-\text{imag}(\Gamma(n))*S2 \quad \text{(Ex. 3)}$$

In the expressions, reat ( ) represents a real part of a complex number in ( ), imag ( ) represents an imaginary part of the complex number in ( ). S1 and S2 are coefficients and determine the amount to update the capacitor capacitance.

(Ex. 2) is an expression for updating the VC1, and (Ex. 3) is an expression for updating the VC2. A VC1($n$) is calculated by adding a real part of the reflection coefficient $\Gamma$ multiplied by a coefficient S1 to a VC1($n-1$) previously updated. A VC2($n$) is calculated by subtracting an imaginary part of the reflection coefficient $\Gamma$ multiplied by a coefficient S2 from a VC2($n-1$) previously updated. In this example, in the VC1 and the VC2, a difference between adding and subtracting the amount to be updated (reat (F)*S1 or imag (F)*S2) depends on a circuit scheme of the matching circuit 30 and the input impedance of the matching load.

A weakness of the algorithm in the background art resides in a condition that the VC1 and the VC2 do not converge on a matching point when the load impedance changes. As described above, the impedance of the plasma load is varied. The impedance of the plasma load is rapidly varied before and after the plasma is ignited, and also varied depending on the type, a flow rate, a pressure, a temperature and so on of a gas to be input to the plasma processing device.

The VC1 and the VC2 for matching the input impedance of the matching circuit 30 to 50Ω (in other words, the reflection coefficient is 0) are determined according to a load impedance connected to the output of the matching box 100. However, since the plasma load is varied, values of the VC1 and the VC2 at the time of matching are also changed. For that reason, the VC1 and the VC2 may not be converged with the use of the algorithms of (Ex. 2) and (Ex. 3). The reason is because the VC1 is calculated by (Ex. 2), in other words, calculated according to a real part of the reflection coefficient, and the VC2 is calculated by (Ex. 3), in other words, calculated according to an imaginary part of the reflection coefficient. However, a relationship between (Ex. 2) and (Ex. 3) may not be established depending on the impedance of the plasma load and the capacitance of the variable capacitance capacitor, and in that case, the VC1 and the VC2 do not converge on matching constants.

CITATION LIST

Patent Literature

PTL 1: PCT International Publication No. WO 2013/132591

SUMMARY OF INVENTION

Technical Problem

As described above, the matching algorithm in the background art suffers from such a problem that convergence on the matching point is difficult when the load impedance is changed. An object of the present invention is to provide a matching algorithm that facilitates converge on a matching point even if a load impedance is changed.

Solution to Problem

A representative configuration of a matching box according to the present invention for solving the above-mentioned problem is as follows.

That is, a matching box including:

a directional coupler that detects a forward wave and a reflected wave;

a matching circuit that includes an input terminal, an output terminal, a first variable capacitance capacitor having one end connected to the input terminal through a first transmission line and the other end grounded, a second variable capacitance capacitor having one end connected to the output terminal through a second transmission line and the other end grounded, and an inductance having one end connected to the one end of the first variable capacitance capacitor and the other end connected to the one end of the second variable capacitance capacitor; and a control unit that controls a capacitance value of the first variable capacitance capacitor and a capacitance value of the second variable capacitance capacitor on the basis of the forward wave and the reflected wave detected by the directional coupler, wherein the control unit calculates a reflection coefficient on the basis of the forward wave and the reflected wave detected by the directional coupler, when a distance between a matching circle that is a circle drawn by a trajectory of the reflection coefficient passing through a matching point on a Smith chart and the calculated reflection coefficient is larger than a predetermined first value, the control unit changes the capacitance value of the second variable capacitance capacitor to cause the distance to fall within the first value, and when the distance falls within the first value, the control unit changes the capacitance value of the first variable capacitance capacitor and sets the calculated reflection coefficient to be smaller than a predetermined second value.

Advantageous Effects of Invention

According to the above configuration, convergence on the matching point becomes easy.

DESCRIPTION OF EMBODIMENTS

First Embodiment

Figure 1:
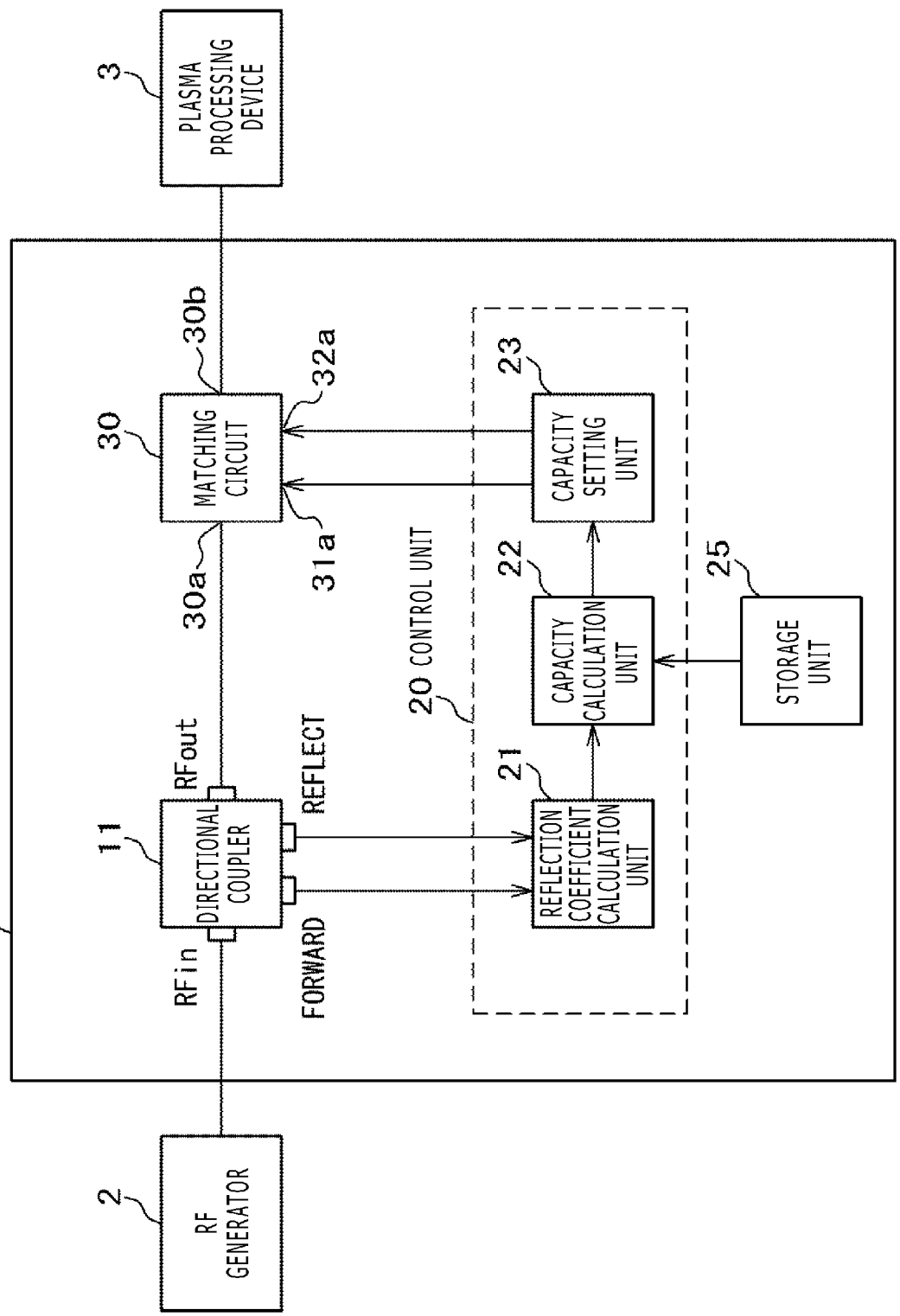
FIG. 1 is a configuration diagram of a matching box according to a first embodiment of the present invention.
Figure 7:
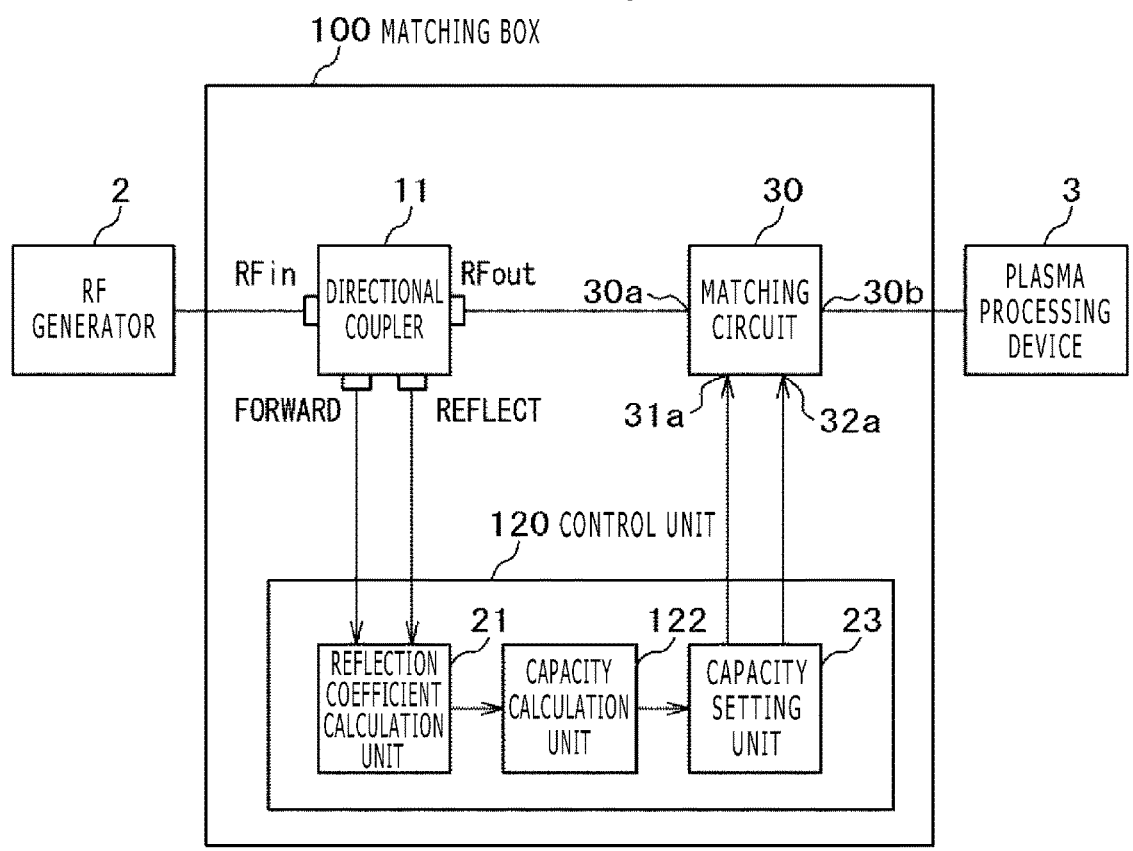
FIG. 7 is a configuration diagram of a matching box according to a background art.

Hereinafter, a first embodiment (first embodiment) of the present invention will be described with reference to the drawings. FIG. 1 is a configuration diagram of a matching box 10 according to the first embodiment of the present invention. In the configuration of FIG. 1, the same components as those in FIG. 7 of the background art are denoted by the same reference numerals, and a description will be appropriately omitted.

The matching box 10 includes a directional coupler 11 that detects a forward wave and a reflected wave, a matching circuit 30 having a matching element that matches an impedance between a RF Generator 2 and a plasma processing device 3, a control unit 20 for controlling a circuit constant of the matching element, and a storage unit 25.

As described above, referring to FIG. 2, the matching circuit 30 includes an input terminal 30a, an output terminal 30b, a first variable capacitance capacitor 31, a second variable capacitance capacitor 32, and the inductor 33. The first variable capacitance capacitor 31 has one end connected to the input terminal 30a through a transmission line 35 and the other end grounded. The second variable capacitance capacitor 32 has one end connected to the output terminal 30b through a transmission line 36 and the other end grounded. The inductor 33 has one end connected to the one end of the first variable capacitance capacitor 31 and the other end connected to the one end of the second variable capacitance capacitor 32.

The control unit 20 is configured to include a reflection coefficient calculation unit 21, a capacitance calculation unit 22, and a capacitance setting unit 23. As described above, the control unit 20 calculates a reflection coefficient based on the forward wave and the reflected wave which are detected by the directional coupler 11, and controls a capacitance value of the first variable capacitance capacitor 31 and a capacitance value of the second variable capacitance capacitor 32 with the use of the reflection coefficient. The storage unit 25 stores information on a matching circle to be described later, and so on. The matching box 10 is different from the matching box 100 in the background art in that the processing contents of the capacitance calculation unit 22, that is, a method for controlling a capacitance VC1 of the variable capacitance capacitor 31 and a capacitance VC2 of the variable capacitance capacitor 31 in the matching circuit 30, and the storage unit 25 that stores the information on the circle are added to the configuration of the matching box 100. The other configurations are identical with those in the matching box 100 of the conventional art.

In this example, the information on the matching circle is the information on the matching circle which is a circle drawn by a trajectory of a reflection coefficient $\Gamma$ passing through a matching point (a point at which a real part and an imaginary part of the reflection coefficient $\Gamma$ are zero) on the Smith chart. The information on the matching circle is information on a position and a size of the circle. There has been known that the information on the matching circle is determined based on the condition of the transmission line 35, that is, a characteristic impedance ZL and a line length L of the transmission line 35.

The capacitance calculation unit 22 calculates the capacitance VC1 of the variable capacitance capacitor 31 and the capacitance VC2 of the variable capacitance capacitor 32 in the matching circuit 30 corresponding to the calculated reflection coefficient $\Gamma$ based on the reflection coefficient $\Gamma$ calculated by the reflection coefficient calculation unit 21 and the information on the matching circle stored in the storage unit 25. In other words, the capacitance calculation unit 22 calculates the VC1 and the VC2 that reduce the calculated reflection coefficient $\Gamma$.

More specifically, the capacitance calculation unit 22 calculates the capacitance VC2 of the variable capacitance capacitor 32 of the matching circuit 30 so that the reflection coefficient $\Gamma$ calculated by the reflection coefficient calculation unit 21 approaches the matching circle stored in the storage unit 25. The capacitance setting unit 23 changes the capacitance value VC2 of the variable capacitance capacitor 32 to the calculated capacitance. As a result, the capacitance setting unit 23 locates the reflection coefficient $\Gamma$ on the matching circle.

Thereafter, the capacitance calculation unit 22 calculates the capacitance VC1 of the variable capacitance capacitor 31 in the matching circuit 30 so as to reduce the reflection coefficient $\Gamma$ calculated by the reflection coefficient calculation unit 21. The capacitance setting unit 23 changes the capacitance value VC1 of the variable capacitance capacitor 31 to the calculated capacitance. As a result, the capacitance setting unit 23 locates the reflection coefficient $\Gamma$ at the matching point (a point at which the reflection coefficient $\Gamma$ is 0).

Information on the matching circle corresponding to the transmission line 35 is stored in the storage unit 25 in advance. As described above, the information (position and size) of the circle is determined on the basis of the conditions of the transmission line 35, in other words, the characteristic impedance ZL and the line length L of the transmission line 35. For example, when the transmission line 35 is as short as can be neglected, the matching circle becomes R1 shown in FIG. 3 to be described below. When the transmission line 35 has the characteristic impedance of 50Ω and the line length of λ/4, the matching circle becomes R2 shown in FIG. 4 or R3 shown in FIG. 5, which will be described later.

Now, a concept of a matching algorithm according to the present embodiment will be described. Values of the VC1 and the VC2 when an impedance between the RF Generator 2 and the plasma processing device 3 matches (that is, the reflection coefficient $\Gamma$ is 0) at a certain plasma load are set to VC1=X and VC2=Y. For facilitating understanding the description, it is assumed that a trajectory of an input impedance of the matching circuit 30 when the capacitance of the VC1 is changed from a state of matching conditions VC1=X and VC2=Y, in other words, a trajectory of the reflection coefficient Γ is shown in the Smith chart of FIG. 3. In that case, the transmission line 35 is assumed to be negligibly short as compared with the wavelength λ of the forward wave and the reflected wave.

Figure 3:
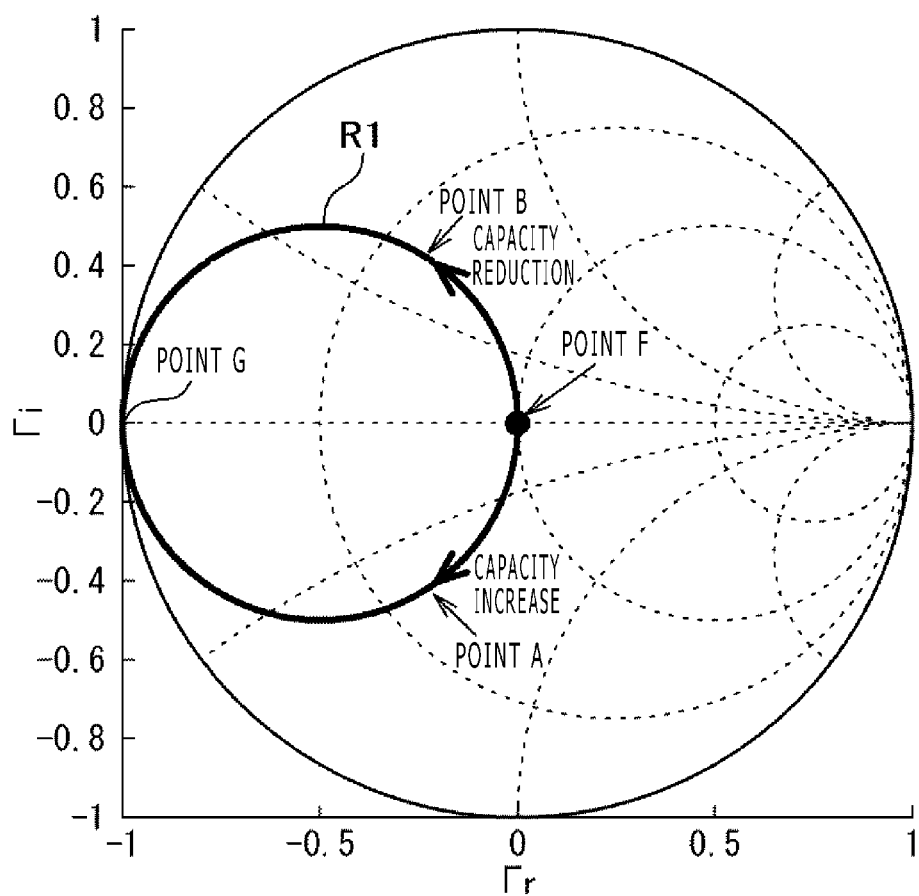
FIG. 3 is a diagram illustrating one example of a trajectory of a reflection coefficient when a capacitance of a variable capacitance capacitor is changed.

In FIG. 3, when the capacitance of VC1 is changed, the trajectory of the reflection coefficient Γ draws a matching circle R1 whose diameter is a line segment connecting a point F, which is a state where matching is established, and a point G. The reflection coefficient Γ at the point F has an imaginary part (ri) of zero and a real part (rr) of zero (the input impedance of the matching box 10 is 50Ω). The reflection coefficient Γ at the point G has the imaginary part of zero and the real part of −1.

In more detail, when the capacitance of VC1 is increased in a state of being matched (point F) in FIG. 3, the reflection coefficient Γ moves on the matching circle R1 in a direction from the point F to a point A. Also, when the capacitance of VC1 is decreased, the reflection coefficient Γ moves on the matching circle R1 in a direction from the point F to a point B. This has been generally known as an impedance trajectory when the variable capacitance capacitors 31 and 32 are connected (grounded) to the ground in a n-type matching circuit 30 of FIG. 2 including the variable capacitance capacitors 31, 32 and the inductance 33, and therefore a detailed description of the above configuration will be omitted.

Figure 4:
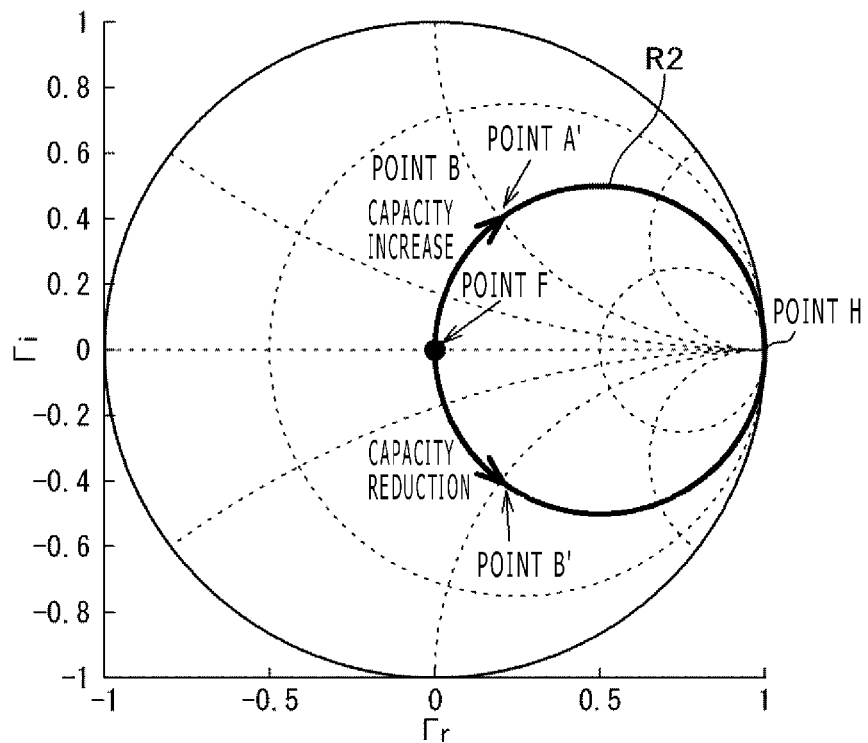
FIG. 4 is a diagram illustrating another example of the trajectory of the reflection coefficient when the capacitance of the variable capacitance capacitor is changed.

FIG. 3 illustrates a case in which the transmission line 35 can be neglected, but the transmission line 35 may not be negligible in reality. The Smith chart of FIG. 4 illustrates the trajectory of the reflection coefficient Γ in the case in which the characteristic impedance of the transmission line 35 is 50Ω and the line length of the transmission line 35 is λ/4. In FIG. 4, it is known that the trajectory of the reflection coefficient Γ draws a matching circle R2 whose diameter is the line segment connecting the point F, which is the state in which matching is established, and the point H. The reflection coefficient Γ at the point H is zero in the imaginary part and 1 in the real part (the input impedance of the matching box 10 is infinite).

Figure 2:
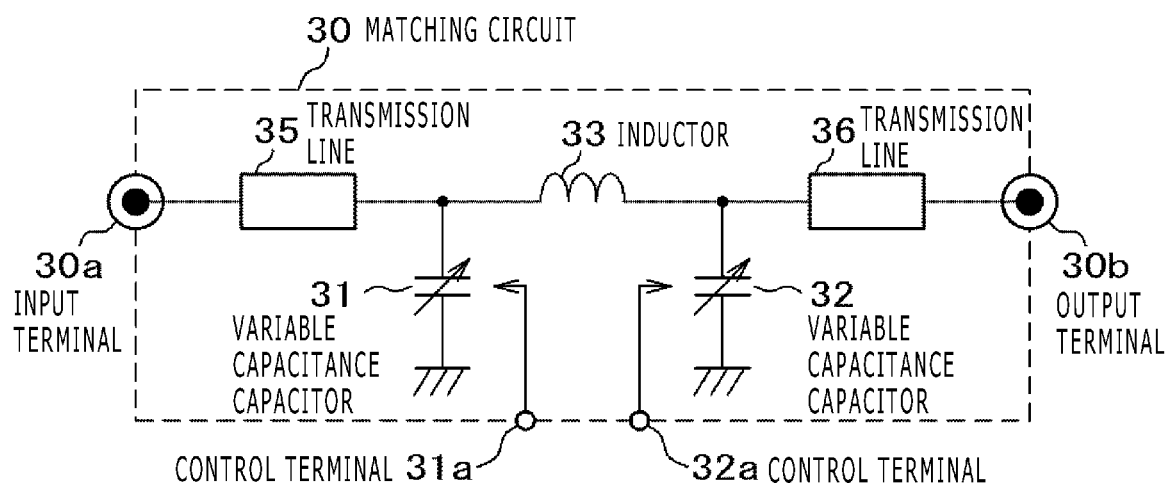
FIG. 2 is a configuration diagram of a matching circuit according to the first embodiment of the present invention.

When it is assumed that an input impedance viewed from a right end of the transmission line 35 is $Z_1$ and an input impedance viewed from a left end of the transmission line 35 is $Z_2$ in the matching circuit 30 of FIG. 2, $Z_2$ is determined by the following (Ex. 4). In (Ex. 4), $Z_1$ is the input impedance when the transmission line 35 is negligible (FIG. 3) and $Z_2$ is the input impedance when the transmission line 35 cannot be ignored (FIG. 4). When the transmission line 35 cannot be ignored (FIG. 4), the circle R1 in FIG. 3 becomes a matching circle R2 in FIG. 4.

$$Z_2 = Z_L \frac{Z_1 + jZ_L \tan\left(\frac{2\pi}{\lambda}L\right)}{Z_L + jZ_1 \tan\left(\frac{2\pi}{\lambda}L\right)}$$ [Ex. 4]

In this way, since the transmission line 35 having the characteristic impedance of 50Ω and the line length of λ/4 is inserted, a trajectory of FIG. 4 is put into a state in which the locus of FIG. 3 is rotated by 180° about a point (point F) at which the real part and the imaginary part of the reflection coefficient Γ are zero. Hence, in FIG. 4, when the capacitance of VC1 is increased in the state where the matching is established (point F), the reflection coefficient Γ moves on the matching circle R2 in a direction of a point A' (the imaginary part of the reflection coefficient Γ is in a positive direction). In addition, when the capacitance of VC1 is reduced, the reflection coefficient Γ moves on the matching circle R2 in a direction of a point B' (the imaginary part of the reflection coefficient Γ is in a negative direction). In other words, on the matching circuit R2 in FIG. 4, when the imaginary part of the reflection coefficient Γ is positive, the VC1 is larger than a matching value X and when the imaginary part of the reflection coefficient Γ is negative, the VC1 is smaller than the matching value X.

In this way, in FIG. 4, when the VC1 is increased or decreased at the matching point (point F), the reflection coefficient Γ follows a trajectory drawing the matching circle R2. This means that when the VC1 is changed in a state where the VC2 is equal to a matching value, the reflection coefficient Γ moves on the matching circle R2 shown in FIG. 4. Therefore, it is understood that the VC2 may be first controlled so that the reflection coefficient Γ is present on the matching circle R2 in FIG. 4, and thereafter the VC1 may be controlled so that the reflection coefficient Γ becomes 0.

Figure 5:
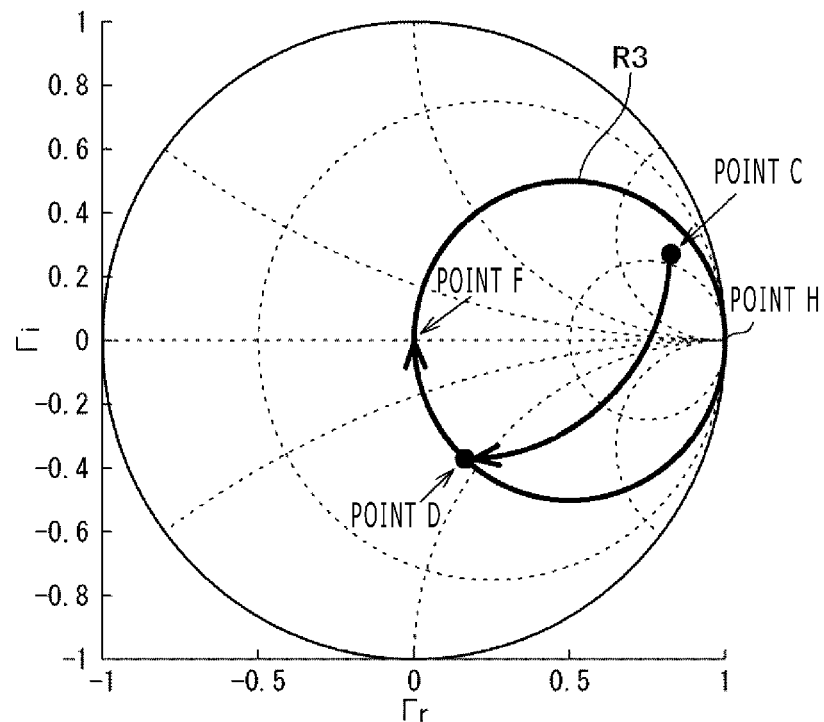
FIG. 5 is a diagram illustrating the trajectory of the reflection coefficient according to the first embodiment of the present invention.

FIG. 5 is a Smith chart illustrating the trajectory of the reflection coefficient Γ in performing the impedance matching according to the embodiment of the present invention when the matching circuit 30 as in FIG. 4, in other words, in the case where the characteristic impedance of the transmission line 35 is 50Ω and the line length of the transmission line 35 is λ/4. A point C is a reflection coefficient Γ when the VC1 and the VC2 are initial values (for example, minimum values of the variable capacitance capacitor) in the case where the plasma load is equal to a certain input impedance value.

First, the control unit 20 increases only the VC2 until the reflection coefficient Γ reaches a point D, which comes in contact with a matching circle R3, from the point C of the initial values of the VC1 and the VC2. The matching circle R3 is the same as the matching circle R2 in FIG. 4. Information on the matching circle R3 is stored in the storage unit 25. When the reflection coefficient Γ reaches the point D that comes in contact with the matching circle R3, the VC2 becomes Y as a capacitance at the time of matching. In that state, the VC2 is controlled to the matching value while the VC1 is kept at the initial value. Therefore, the control unit 20 next increases the VC1. As the VC1 is increased, the reflection coefficient Γ moves on the matching circle R3 as described above. Therefore, when the VC1 is increased to cause the reflection coefficient Γ to reach 0, an increase in the VC1 may stop. The VC1 at that time becomes X as a capacitance at the time of matching.

A trajectory in FIG. 5 is an example when the input impedance of the plasma load is a certain value, and when the input impedance of the plasma load is changed, the positions of the point C and the point D are naturally changed. When the VC2 is the capacitance at the time of matching, the fact that the reflection coefficient Γ is present on the circle R3 does not change.

Moreover, when the point C in FIG. 5, the minimum value of the variable capacitance capacitor is selected as the initial values of the VC1 and the VC2, but the maximum value of the variable capacitance capacitor may be selected or any other value may be selected. In that case, the position of the point C is naturally changed. However, whatever the initial values of the VC1 and the VC2 are, if the VC2 is the value at the time of matching, when the VC1 is changed, the phenomenon that the reflection coefficient Γ moves on the matching circle R3 remains unchanged.

Therefore, the operation of the control unit 20 that controls only the VC2 until the reflection coefficient Γ comes in contact with the matching circle R3 and controls only the VC1 after the reflection coefficient Γ has come in contact with the matching circle R3 is not changed. Under the control of the VC2, when the VC2 is larger than Y which is the matching value, since the reflection coefficient Γ is outside the matching circle R3, the reflection coefficient Γ is controlled so as to come in contact with the matching circle R3 with a reduction in the VC2. Conversely, if the VC2 is smaller than Y which is the matching value, since the reflection coefficient Γ falls within the matching circle R3, the reflection coefficient Γ is controlled so as to come in contact with the matching circle R3 with an increase in the VC2.

Then, after the VC2 has been controlled so that the reflection coefficient Γ comes in contact with the matching circle R3, the VC1 is controlled as follows. In other words, when the imaginary part of the reflection coefficient Γ is positive, since the VC1 is higher than the matching value X, the reflection coefficient Γ is controlled to be O with a reduction in the VC1. Conversely, when the imaginary part of the reflection coefficient Γ is negative, since the VC1 is smaller than X, the reflection coefficient Γ is controlled to be 0 with an increase in the VC1.

Also, even when the input impedance of the plasma load changes during the control of the VC1 and the VC2, the VC2 and the VC1 are controlled as described above. In other words, after the VC2 has been controlled so that the reflection coefficient Γ comes in contact with the matching circle R3, the VC1 is controlled.

In the description of FIGS. 4 and 5, the conditions that the characteristic impedance of the transmission line 35 is 50Ω and the line length of the transmission line 35 is λ/4 in the matching circuit 30 of FIG. 2 have been described as an example. However, the present invention is not limited to those conditions. If the conditions of the transmission line 35 are different from the conditions described above, since the trajectory of the circle when the VC1 is changed under the condition that the VC2 is the capacitance at the time of matching is different from the trajectory of the matching circle R3 shown in FIGS. 4 and 5, a trajectory of the circle satisfying the conditions of the transmission line 35 may be set according to (Ex. 4) described above.

Figure 6:
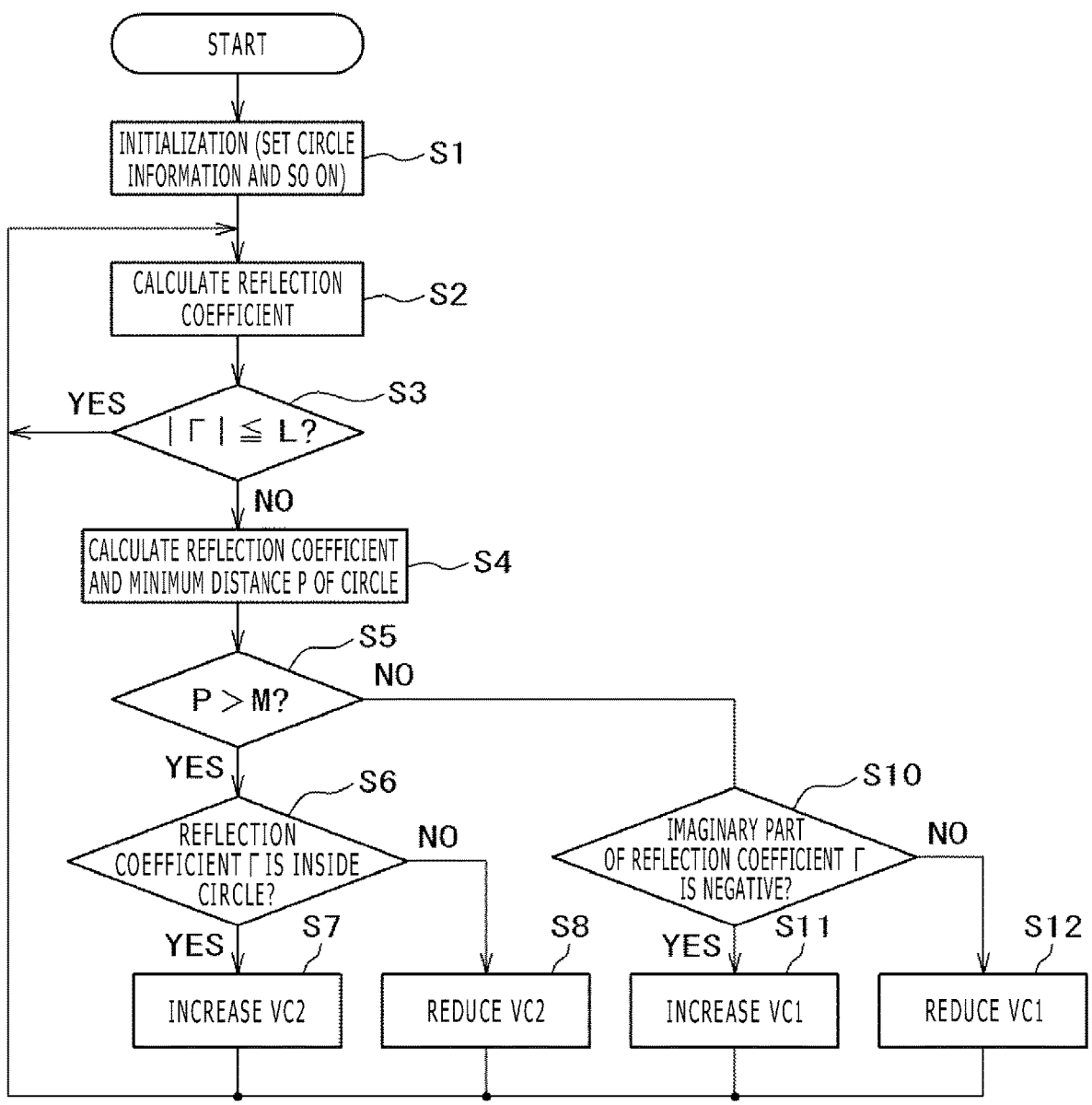
FIG. 6 is a processing flowchart of impedance matching according to the first embodiment of the present invention.

FIG. 6 is a processing flowchart of the impedance matching according to the first embodiment of the present invention. The process is executed in the control unit 20. First, as initialization, information on the matching circle shown in FIGS. 4 and 5 (the position and the size on the Smith chart) is saved in the storage unit 25 (Step S1 in FIG. 6). As described above, since the information on the matching circle is determined by the transmission line 35, there is a need to give information corresponding to the matching circuit 30. In addition, in Step S1, initial values of the VC1 and the VC2 are also set.

Next, the reflection coefficient Γ at that time is calculated based on the forward wave Pf and the reflected wave Pr obtained from the directional coupler 11 (Step S2). Next, an absolute value of the reflection coefficient Γ is compared with a predetermined value L (Step S3). When the absolute value of the reflection coefficient Γ is equal to or smaller than the L (Yes in Step S3), the process returns to Step S2, and the forward wave Pf and the reflected wave Pr are acquired from the directional coupler 11, and the reflection coefficient Γ at that time is again calculated.

When the absolute value of the reflection coefficient Γ is larger than the L (No in Step S3), the process goes to Step S4. The L is a threshold for determining that matching has been established, and ideally 0. Actually, because it is difficult to set the reflection coefficient Γ to 0, the determination is made with the provision of a certain threshold L. The L is a value determined according to an anti-reflection power of the high frequency power supply 2 or a required specification of the plasma processing device 3 using the RF Generator 2.

In Step S4, in order to determine whether there is the reflection coefficient Γ on the matching circle defined in the initialization (Step S1), or not, information on the matching circle is acquired from the storage unit 25, and a minimum distance P of a distance between the reflection coefficient Γ and the matching circle is calculated. When the value P is larger than a predetermined threshold M (yes in Step S5), since the VC2 is not the matching value, the VC2 is controlled so as to change. More specifically, the reflection coefficient Γ is determined not to be present on the matching circle, and the process proceeds to Step S6. Ideally, the M is also 0, but in reality, it is difficult to set the M to 0, and therefore the threshold value M is set to a predetermined value. In this manner, in the case where the threshold M is set so that the load has a fluctuation like a plasma, hunting that the reflection coefficient moves on and off the circumference of the matching circle every time the VC2 is switched can be reduced.

When the P is equal to or smaller than the predetermined threshold value M (No in Step S5), since the VC2 is the matching value, there is no need to change the VC2. Therefore, the process proceeds to the operation of controlling the VC1 (that is, the variable capacitance capacitor 31). In other words, it is determined that the reflection coefficient Γ is present on the matching circle, and the process proceeds to Step S10.

In Step S6, it is determined whether the reflection coefficient Γ falls inside the matching circle, or not, in order to determine a direction in which the VC2 (that is, the variable capacitance capacitor 32) is controlled. When the reflection coefficient Γ is inside the matching circle (Yes in Step S6), since the VC2 is smaller than Y, the VC2 is increased (Step S7). When the reflection coefficient F is outside the matching circle (No in Step S6), since the VC2 is larger than Y, the VC2 is decreased (Step S8). At this time, the amount of decrease and the amount of increase may be set in advance.

In this way, the processing from Step S2 to Step S7 or S8 is repeated, thereby being capable of setting P to the predetermined threshold M or lower. In other words, the reflection coefficient Γ can be put almost on the matching circle. In this way, when it is determined that P is equal to or smaller than M in Step S5, the process proceeds to Step S10, and the operation of controlling the VC1 (that is, the variable capacitance capacitor 31) is performed.

In Step S10, it is determined whether the imaginary part of the reflection coefficient Γ is negative, or not, in other words, whether the VC1 is smaller than X, or not. As described above, when the imaginary part of the reflection coefficient Γ is negative, the VC1 is smaller than X, and when the imaginary part of the reflection coefficient Γ is positive, the VC1 is larger than X. Therefore, when the imaginary part of the reflection coefficient Γ is negative (yes in Step S10), the VC1 is increased. When the imaginary part of the reflection coefficient Γ is positive (no in Step S10), the VC1 is decreased. In this manner, with a change in the VC1, the reflection coefficient Γ approaches zero. In this case, the amount of increase and decrease is set in advance.

When the VC2 is smaller than the predetermined value, for example, when the VC2 is smaller than 10 pF in the matching circuit 30 of FIG. 2, it is empirically understood that the reflection coefficient Γ does not reach the matching point even if the control switches to the VC1 control when the reflection coefficient Γ is placed on the matching circle. Therefore, in such a case, the VC2 is gradually increased until the voltage becomes equal to or larger than a predetermined value, and after the VC2 has been equal to or higher than the predetermined value, the matching process in FIG. 6 is performed. The predetermined value changes depending on a value of the inductance 33 of the matching circuit 30, but can be acquired by conducting an experiment in advance.

Figure 8:
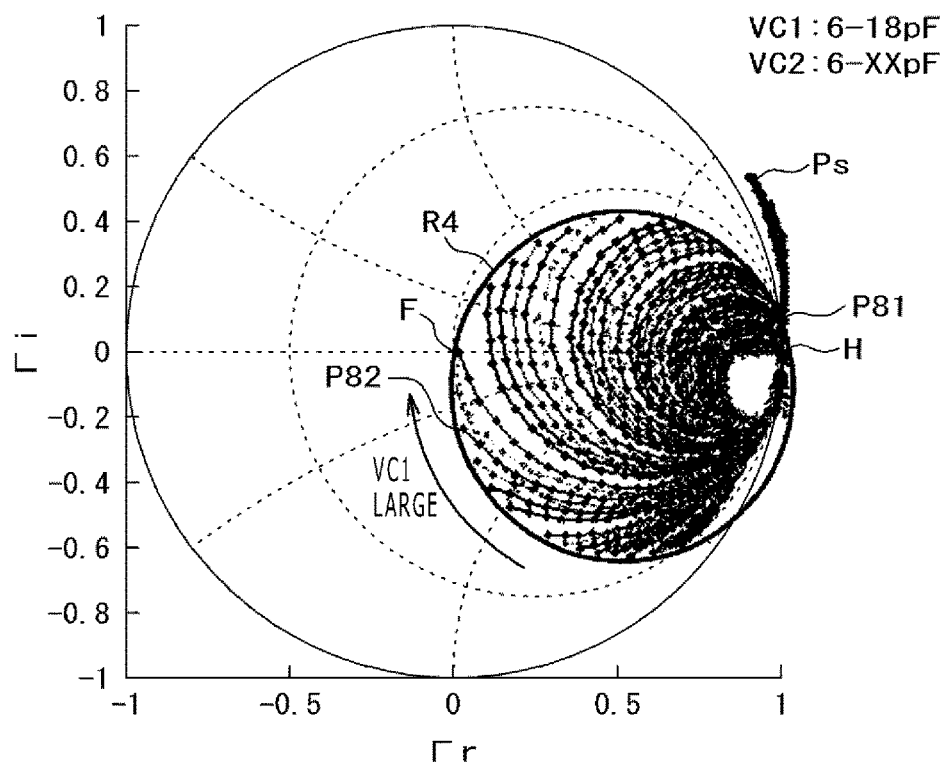
FIG. 8 is a diagram illustrating the trajectory of the reflection coefficient when a VC1 is fixed and a VC2 is changed.

FIG. 8 is a diagram illustrating the trajectory of the reflection coefficient when the VC1 is fixed and the VC2 is changed in the matching circuit 30 of the first embodiment. In other words, multiple graphs in which the VC2 is changed in a state where the VC1 is fixed are created with a change in the VC1. In an example of FIG. 8, the VC1 is fixed to 6 pF and the VC2 is gradually increased from 6 pF. At this time, the reflection coefficient Γ draws a trajectory that gradually moves from an initial value Ps in FIG. 8 and reaches a matching circle R4 in the vicinity of a point H (a real part is 1 and an imaginary part is 0). In this way, when a process of increasing the VC2 from 6 pF while fixing the VC1 to a gradually larger value is repeated, a point at which the reflection coefficient Γ reaches the matching circle R4 moves on the circumference of the matching circle R4 in a clockwise direction.

For example, when the VC1 is fixed at a dozen pF and the VC2 gradually increases from 6 pF, the reflection coefficient Γ draws an arc-shaped trajectory that gradually moves from the initial value Ps in FIG. 8 and reaches the matching circle R4 at a P82. At this time, the trajectory of the reflection coefficient Γ starts from the initial value Ps, reaches the matching circle R4 at a P81, then passes through the matching circle R4 and reaches the P82. The VC2 at the P81 is less than 10 pF, and the VC2 at the P82 is equal to or more than 10 pF. Therefore, at the P81, the control does not go to the VC1 control and at the P82, the control goes to the VC1 control.

As described above, when the VC2 at the time of starting the matching process is smaller than a predetermined value (when the matching circuit 30 of FIG. 2, the VC2 is less than 10 pF), the VC2 is gradually increased till the predetermined value or more, and after the VC2 has been equal to or more than the predetermined value, there is a need to perform the matching process of FIG. 6. Incidentally, the reason that the VC2 at the time of starting the matching process is not made to reach the predetermined value or more at once, and the VC2 is gradually increased is because plasma ignition of the load does not go well without the above process.

As described above, the control unit 20 calculates the reflection coefficient based on the forward wave and the reflected wave detected by the directional coupler 11. When a distance between the matching circle drawn by the trajectory of the reflection coefficient passing through the matching point on the Smith chart and the calculated reflection coefficient is larger than a first value, the capacitance value of the second variable capacitance capacitor 32 is changed. The calculated reflection coefficient is changed to set the distance to fall within the first value. When the distance falls within the first value, the capacitance value of the first variable capacitance capacitor 31 is changed and the calculated reflection coefficient is set to be smaller than a second value without changing the distance.

According to the first embodiment, at least the following advantages are obtained.

(A1) When the distance between the matching circle drawn by the trajectory of the reflection coefficient passing through the matching point on the Smith chart and the calculated reflection coefficient is larger than the predetermined first value, the capacitance value of the second variable capacitance capacitor is changed. The calculated reflection coefficient is changed to set the distance to fall within the first value. When the distance falls within the first value, the capacitance value of the first variable capacitance capacitor is changed and the calculated reflection coefficient is set to be smaller than the predetermined second value. Therefore, convergence on the matching target is facilitated.

<Characteristics of Circle Matching>

In the impedance matching according to the first embodiment, the trajectory of the VC1 passing through a matching point ((U, V)=(0, 0)) (the trajectory of the reflection coefficient Γ when controlling the VC1) and the control (operation) of the VC2 at each load has exactly the same regularity. In this case, U is the real part of the reflection coefficient Γ and V is the imaginary part of the reflection coefficient Γ. In other words, even if the load is different, after only the VC2 is controlled so that the reflection coefficient Γ is placed on the circumference of the matching circle, if the control switches to the control of the VC1, the reflection coefficient Γ always goes to (U, V)=(0, 0) (this operation is called circle matching).

However, when the circle matching according to the first embodiment, the following operations (1) and (2) may occur. (1) When the reflection coefficient Γ is to be placed on the circumference of the matching circle with only the VC2 control, useless operation such that the reflection coefficient Γ moves to a position away from the matching point, is placed on the circumference and again comes back toward the matching point depending on the load impedance may occur. Since the above operation is unnecessary in terms of operation and time, but also causes an impedance to be deteriorated, when plasma ignition occurs during the matching operation, the plasma may be misfired due to the above operation.

(2) In the operation of moving to the matching point on the circumference of the matching circle under the VC1 control, the matching circle R4 may not become a perfect circle depending on the load condition, and the reflection coefficient may deviate from the circumference in the operation only with the VC1 control.

Second Embodiment

A matching box according to a second embodiment (second embodiment) of the present invention prevents the operation of the above items (1) and (2) and reduces the deterioration of the impedance.

A matching box 10A according to the second embodiment is configured such that the capacitance calculation unit 22 is replaced with a capacitance calculation unit 22A in the matching box 10 of the first embodiment (FIG. 1). In other words, the matching box 10A is different from the first embodiment in the processing content of the capacitance calculation unit 22, that is, a method of controlling a capacitance VC1 of a variable capacitance capacitor 31 and a capacitance VC2 of a variable capacitance capacitor 32 in a matching circuit 30. The other configuration of the matching box 10A according to the second embodiment is the same as that of the matching box 10 in the first embodiment.

The capacitance calculation unit 22A of the matching box 10A according to the second embodiment includes the control of the capacitance calculation unit 22 according to the first embodiment (a circumference approach control for changing the VC2 such that a reflection coefficient approaches a circumference of a matching circle, and a matching point approach control for changing the VC1 such that the reflection coefficient approaches zero), and the following controls (1) and (2) are added to the capacitance calculation unit 22 in the first embodiment.

(1) At the time of controlling the VC2 (in the operation of moving the reflection coefficient Γ toward the circumference of the matching circle), the VC1 is finely adjusted to restrain the reflection coefficient Γ from moving away from the matching point as compared with a case in which the VC1 is not finely adjusted. In other words, the VC2 control is not the operation based on a simple direction determination, but is set as a prediction control for calculating and predicting an intersection point with the matching circle (circumference), and leads the reflection coefficient Γ to the intersection point.

Specifically, the direction of the fine adjustment of the VC1 is determined based on a position of a circumference passage predicted point which is an intersection point between a predicted trajectory of the reflection coefficient Γ and the circumference of the matching circle to control the VC2 and the VC1. With the above control, the deterioration of the impedance can be reduced in a transient state at the time of matching not depending on the load condition, and matching can be performed at a high speed.

(2) At the time of controlling the VC1 (in the operation of moving the reflection coefficient Γ moves closer to the matching point along the circumference of the matching circle), when the reflection coefficient Γ deviates from a circumferential area, the VC2 is finely adjusted, and the reflection coefficient Γ is returned into the circumferential area. As will be described later, the circumferential area is an area that is surrounded by two concentric circles on the inside and the outside of the matching circle, which are separated from the matching circle by a predetermined distance. The direction of the VC2 fine adjustment is a decreasing direction when the reflection coefficient Γ is deviated outside the circumferential area, and an increasing direction when the reflection coefficient Γ is deviated inside the circumferential area.

Figure 9:
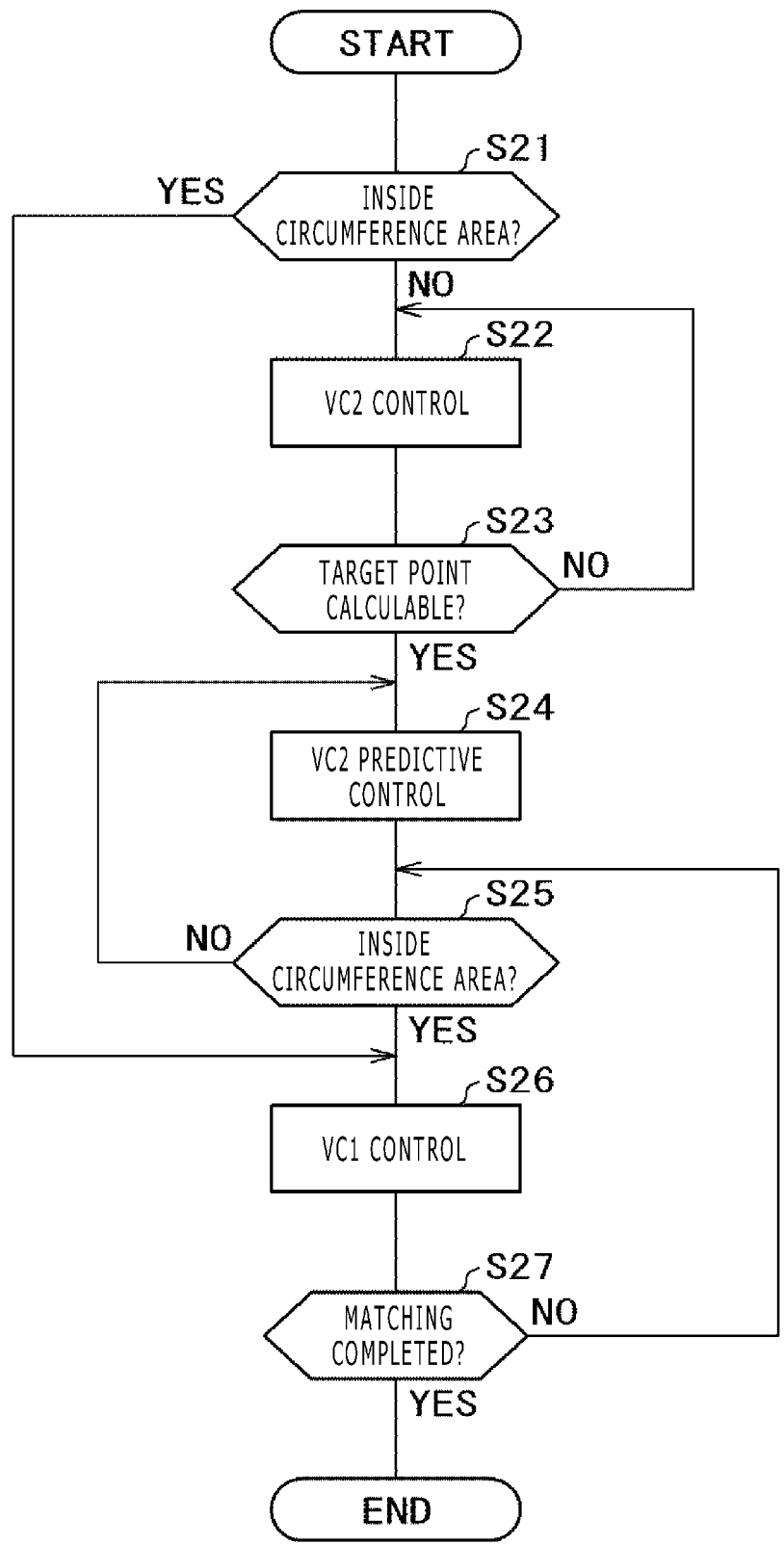
FIG. 9 is a processing flowchart of an impedance matching according to a second embodiment of the present invention.

The impedance matching process according to the second embodiment of the present invention will be described with reference to FIGS. 9 and 10. FIG. 9 is a processing flowchart of the impedance matching according to the second embodiment of the present invention.

Figure 10:
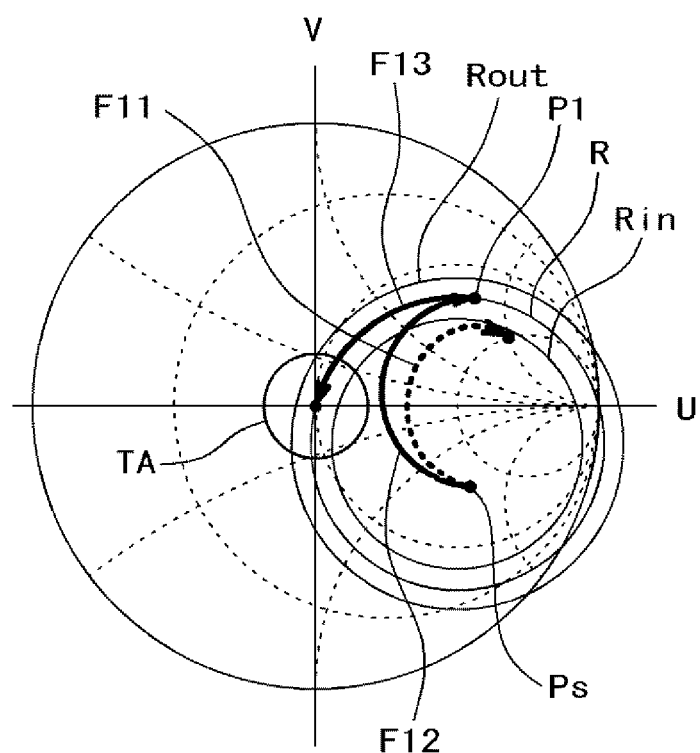
FIG. 10 is a diagram illustrating a trajectory of a reflection coefficient according to the second embodiment of the present invention.

FIG. 10 is a Smith chart illustrating the trajectory of the reflection coefficient according to the second embodiment of the present invention. Reference symbol R is a matching circle (circle drawn by the trajectory of the reflection coefficient Γ passing through the matching point on the Smith chart). The circumferential area is an area within a predetermined distance range from the circumference of the matching circle R and is an area between a circumference of a circle Rin inside the matching circle R and a circumference of a circle Rout outside the matching circle R. In other words, as described in the first embodiment, the circumferential area is an area in which a distance P between the circumference of the matching circle R and the reflection coefficient Γ is equal to or less than a threshold value M (refer to FIG. 6).

Reference symbol Ps is the position of the reflection coefficient Γ at a certain time (for example, at the time of starting the impedance matching process). Reference symbol F12 is the trajectory of the reflection coefficient Γ during the VC2 control according to the second embodiment. Reference symbol F13 is the trajectory of the reflection coefficient Γ at the time of the VC1 control according to the second embodiment. Reference symbol P1 is an intersection point of matching circle R and the F12. Reference symbol TA is a target area to be described in a third embodiment to be described later.

In the matching process of the second embodiment, the reflection coefficient Γ reaches a P1 from a Ps along the F12 under the VC2 control and reaches the matching target point from the P1 along the F13 under the VC1 control. The matching target point is an area in which the coefficient Γ is equal to or smaller than a predetermined value L described in the first embodiment (refer to FIG. 6). Incidentally, the F11 is the trajectory of the reflection coefficient Γ during the VC2 control in the first embodiment. In the F12, as compared with the F11, it is understood that the reflection coefficient Γ is prevented from moving away from the matching point, that is, impedance deterioration is reduced.

Hereinafter, the respective steps in FIG. 9 will be described. The impedance matching process shown in FIG. 9 is executed in the capacitance calculation unit 22A.

(1) Determination as to whether the Reflection Coefficient Falls within the Circumferential Area, or not (Step S21)

In Step S21, it is determined whether the reflection coefficient Γ (the reflection coefficient Γ at the position Ps: the reflection coefficient at the first position) at that time falls within the circumferential area, or not. When the reflection coefficient Γ falls within the circumferential area (Yes in S21), the process proceeds to Step S26 to perform the VC1 control. When the reflection coefficient Γ does not fall within the circumferential area (No in S21), the process proceeds to Step S22.

(2) VC2 Control (Step S22)

In Step S22, the VC2 control is performed as in the first embodiment. In other words, the VC2 is changed so that the reflection coefficient Γ approaches the circumference of the matching circle R from the position Ps, and the changed reflection coefficient Γ (the reflection coefficient at the second position) is acquired. In an example of FIG. 10, since the position Ps is located inside the matching circle R, the VC2 is increased (refer to FIG. 6 in the first embodiment).

(3) Determination as to whether the Target Point can be Calculated, or Not (Step S23)

Next, it is determined whether the VC2 prediction control described above is enabled, or not. In other words, it is determined whether the target point in the VC2 prediction control can be calculated, or not. The target point is a circumference passage predicted point which is an intersection point between the predicted trajectory of the reflection coefficient Γ and the matching circle R. When the target point can be calculated (Yes in S23), the process proceeds to Step S24, and the circle VC2 prediction control is performed after the circumference passage predicted point has been acquired. If the target point cannot be calculated (No in S 23), the process returns to Step S22 (No in S23).

In order to obtain the target point (circumference passage predicted point), there is a need to have two or more points (reflection coefficient calculation points) for calculating the reflection coefficient Γ on UV coordinates. When there are two reflection coefficient calculation points, a straight line connecting the two reflection coefficient calculation points is set as a predicted trajectory of the reflection coefficient Γ and an intersection point of the predicted trajectory and the matching circle R is set as the circumference passage predicted point. When the above Step S22 has been performed once (that is, the VC2 has been changed once), two reflection coefficient calculation points including the reflection coefficient calculation point (first position) before the VC2 is changed and the reflection coefficient calculation point after the VC2 has been changed (second position) can be provided. The reflection coefficient calculation point before the VC2 is changed is a reflection coefficient calculation point when the VC2 is an initial value (that is, when the reflection coefficient Γ is present at the position Ps).

When there are three reflection coefficient calculation points, a circle (matching movement trajectory predicted circle Cp) calculated from the three reflection coefficient calculation points can be set as the predicted trajectory of the reflection coefficient Γ, and the intersection point of the predicted trajectory and the matching circle R can be set as the circumference passage predicted point. In that case, there is a need to perform the above Step S22 at least twice.

(4) VC2 Prediction Control (Step S24)

After the circumference passage predicted point acquisition control for acquiring the circumference passage predicted point has been performed, the VC2 is changed so that the reflection coefficient Γ approaches the circumference passage predicted point, in other words, the circumference approach control is performed. The amount of change of the VC2 is adjusted based on the position of the reflection coefficient Γ at that time (before the VC2 is changed and the position of the circumference passage predicted point on the Smith chart. For example, the amount of change of the VC2 is adjusted based on a distance Dv between the position of the reflection coefficient Γ at that time and the circumference passage predicted point. More specifically, when the distance Dv is long, the amount of change of the VC2 is increased, and when the distance Dv is short, the amount of change of the VC2 is reduced. The amount of change of the VC2 according to the distance Dv is acquired in advance by experiment or the like. The distance Dv may be a linear distance between the position of the reflection coefficient Γ at that time and the circumference passage predicted point, or may be a length of an arc as shown in Example 22 to be described later.

Also, in the VC2 prediction control in Step S24, the VC1 is finely adjusted based on the circumference passage predicted point. Specifically, when a V coordinate (that is, the imaginary part) of the predicted circumference passage predicted point is negative, the VC1 is finely adjusted so as to increase, and when the V coordinate of the predicted circumference passage predicted point is positive, the VC1 is finely adjusted so as to decrease. In an example of FIG. 10, since the V coordinate of the circumference passage predicted point is positive, the VC1 is decreased.

(5) Determination as to whether the Reflection Coefficient Falls within the Circumferential Area, or Not (Step S25)

After the VC2 has been changed in Step S24, it is determined whether the changed reflection coefficient Γ falls within the circumference area, or not. When the reflection coefficient Γ falls within the circumferential area (Yes in S25), that is, when a distance between the reflection coefficient Γ and the matching circle R falls within a predetermined value, the process proceeds to Step S26 to perform the VC1 control. When the reflection coefficient Γ does not fall within the circumferential area (No in S25), the process returns to Step S24.

(6) VC1 Control (Step S26)

In the same way as in the first embodiment, the matching operation by changing the VC1 (the operation of approaching the matching target point along the circumference of the matching circle R), that is, matching point approach control is performed. In an example of FIG. 10, the VC1 is reduced so that the reflection coefficient Γ approaches zero (refer to FIG. 4).

(7) Determination of Matching completion (Step S27)

It is determined whether the reflection coefficient Γ has reached the matching target point, or not. When the reflection coefficient Γ has reached the matching target point (Yes in S27), the impedance matching process is terminated. When the reflection coefficient Γ has not reached the matching target point (no in S27), the process returns to Step S25. In this way, when the VC1 is changed, the reflection coefficient Γ is prevented from deviating from the circumferential area. When the reflection coefficient Γ deviates from the circumferential area (No in S25), the VC2 is controlled to return the reflection coefficient Γ to the inside of the circumferential area (S24). More specifically, the VC2 is reduced when the reflection coefficient Γ deviates from the circumferential area, and the VC2 is increased when the reflection coefficient Γ falls within the circumferential area.

Example 21

Figure 12:
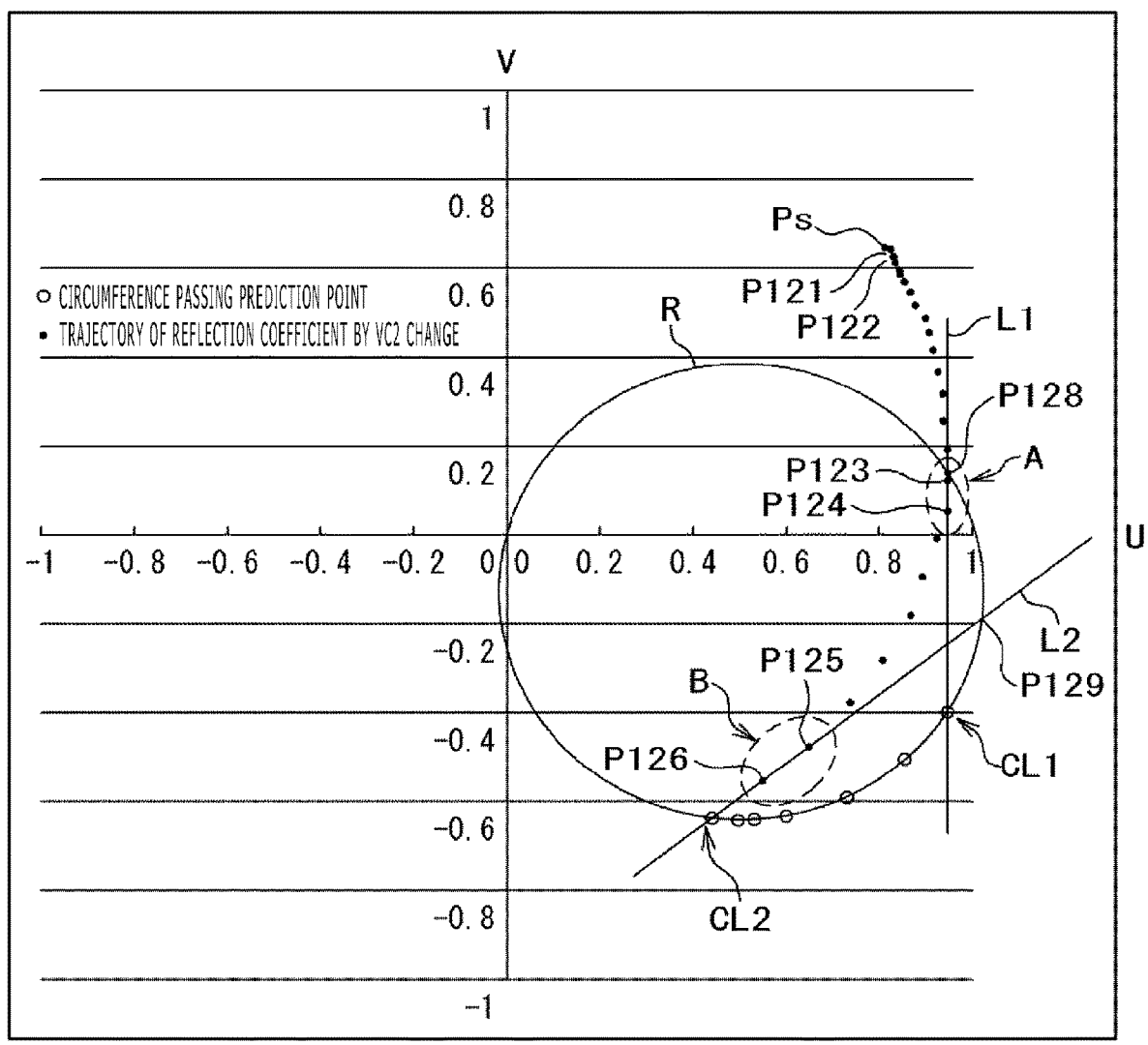
FIG. 12 is a diagram illustrating a first example of the second embodiment.

A first example (Example 21) for obtaining a circumference passage predicted point in the VC2 prediction control according to the second embodiment will be described with reference to FIG. 12. FIG. 12 is a diagram illustrating the operation of obtaining the circumference passage predicted point in the VC2 prediction control. In FIG. 12, a solid circle ● is the trajectory of the reflection coefficient Γ by the VC2 change. An outline circle ○ is a circumference passage predicted point.

In an example of FIG. 12, the Ps of the solid circle ● is the position of the reflection coefficient Γ at the time of starting the impedance matching process. A P121 is a position of the reflection coefficient Γ when the VC2 has been changed once (S22 in FIG. 9). As described above, in order to obtain the circumference passage predicted point, there is a need to have two or more points (reflection coefficient calculation points) for calculating the reflection coefficient Γ on the UV coordinates. When two reflection coefficient calculation points are provided, an intersection point between a straight line connecting the two reflection coefficient calculation points and the matching circle R is the circumference passage predicted point.

However, since the straight line connecting the Ps and the P121 does not intersect with the matching circle R, the circumference passage predicted point cannot be obtained. Therefore, a second VC2 change (S22 in FIG. 9) is performed to obtain a position P122 of the reflection coefficient Γ. However, since the straight line connecting the P121 and the P122 does not intersect with the matching circle R, the circumference passage predicted point cannot be obtained. In this way, the VC2 change (S22 in FIG. 9) is sequentially performed to search the circumference passage predicted point.

For example, a straight line L1 connecting the two points (P123 and P124) in a dashed ellipse A in FIG. 12 intersects with the matching circle R at an intersection point P128 and an intersection point CL1. Since the VC2 at the intersection point P128 is smaller than the predetermined value (for example, 10 pF) described in the first embodiment, even if the control switches to the VC1 control at the intersection point P128, the reflection coefficient Γ does not reach the matching target point. Therefore, in an example of FIG. 12, the intersection point CL1 is set as the circumference passage predicted point to change the VC2 (S24 in FIG. 9).

At that time, since the V coordinate at the intersection point CL1 is negative, the VC1 is finely adjusted so as to increase with the VC2 change.

In this way, the VC2 prediction control (S24 of FIG. 9) is sequentially performed, for example, the VC2 prediction control is performed at a P125 in an ellipse B of FIG. 12 to obtain a P126. A straight line L2 connecting the P125 and the P126 intersects with the matching circle R at an intersection point P129 and an intersection point CL2. In that case, the intersection point CL2 close to a forward direction of the reflection coefficient Γ at the time of changing the VC2 is set as the circumference passage predicted point to change the VC2 (S24 in FIG. 9). At that time, since the V coordinate of the intersection point CL2 is negative, the VC1 is finely adjusted so as to increase.

In this way, since the circumference passage predicted point is updated every time the VC2 is changed, the matching operation can be performed according to an external load variation.

Example 22

In Example 21, the intersection point between the straight line obtained from the two points and the matching circle is set as the circumference passage predicted point. However, in order that the trajectory of an actual reflection coefficient Γ draws an arc, the circumference passage predicted point according to Example 21 is located away from a point at which the trajectory of the reflection coefficient Γ and the matching circle actually intersect with each other. In Example 2 (Example 22) of the second embodiment, in the VC2 prediction control, the intersection point between a circle obtained from three points of the reflection coefficient Γ and the matching circle is set as the circumference passage predicted point, thereby being capable of performing more precise prediction.

Figure 13:
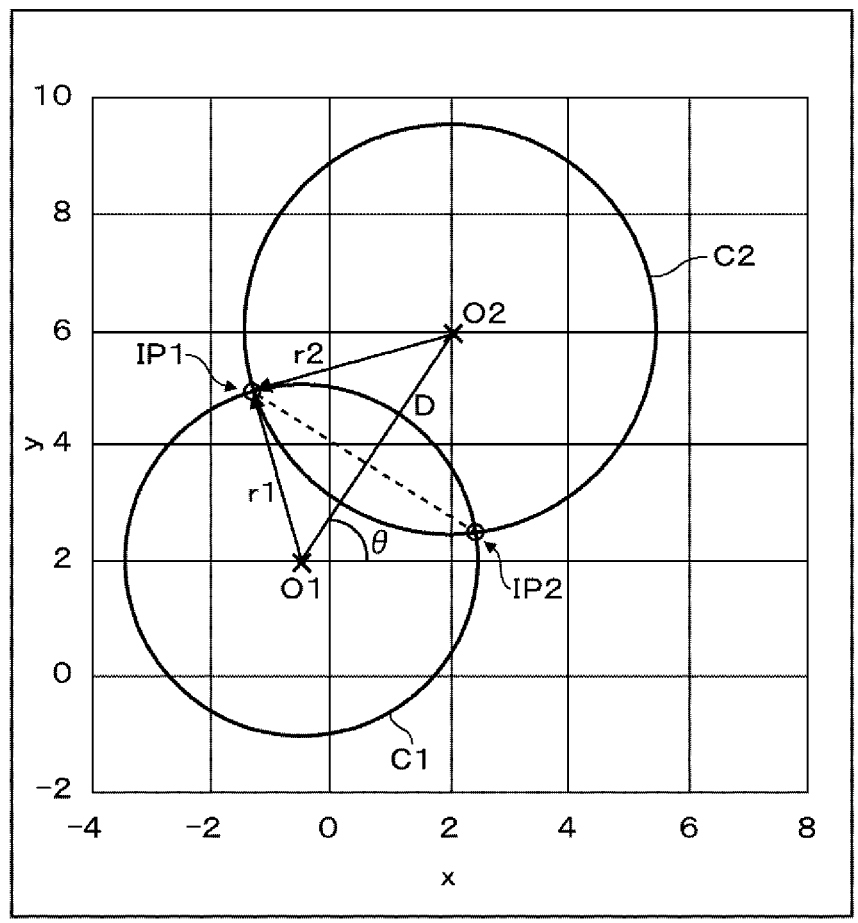
FIG. 13 is a diagram illustrating a second example of the second embodiment.

Example 22 will be described with reference to FIGS. 13 and 14.

An equation of the circle is expressed by the following expression (Ex. 5).

$$(X-a)2+(Y-b)2=r2 \quad \text{(Ex. 5)}$$

Since there are three variables a, b and r, if there are three points, those variables are substituted into the above expression (Ex. 5), thereby being capable of obtaining the equation of the circle.

The intersection point of the trajectory circle (matching movement trajectory predicted circle Cp) of the movement predicted from the three points of the reflection coefficient Γ during matching operation and the matching circle can be calculated by the following method. As shown in FIG. 13, a circle C1 (for example, matching movement trajectory predicted circle Cp) is represented by a center coordinate 01 (xc1, yc1) and a radius (r1) of the circle C1. A circle C2 (for example, matching circle) is expressed by a center coordinate 02 (xc2, yc2) and a radius (r2) of the circle C2.

A distance (D) between the centers and an angle (θ) between the centers are represented by the following expressions.

$$D=\sqrt{((xc2-xc1)2+(yc2-yc1)2)} \quad \text{(Ex. 6)}$$

$$\theta=\tan-1((yc2-yc1)/(xc2-xc1)) \quad \text{(Ex. 7)}$$

Figure 14:
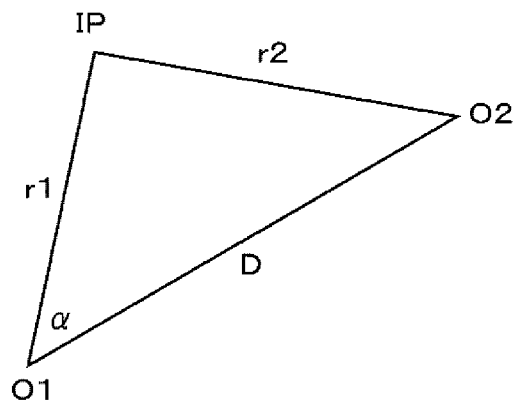
FIG. 14 is a diagram illustrating a second example of the second embodiment.

D is obtained from the above expression (Ex. 6), and the lengths of all sides (D, r1, r2) of a triangle shown in FIG. 14 are obtained. The angle (α) can be obtained based on the lengths of those three sides (D, r1, r2) according to the cosine theorem (the following expressions (Ex. 8) (Ex. 9) and (Ex. 10)).

An expression (Ex. 10) is obtained from the following expressions (Ex. 8) and (Ex. 9).

$$\cos(\alpha)=(D2+r12-r22)/(2 \cdot D \cdot r1) \quad \text{(Ex. 8)}$$

$$C=\cos(\alpha) \quad \text{(Ex. 9)}$$

$$\alpha=\cos-1(c)=\alpha \cos(c) \quad \text{(Ex. 10)}$$

An intersection point lP1 (xp1, yp1) is separated by the radius (r1) from a center 01(xc1, yc1) in a direction of an angle (θ+α). Hence, the intersection point 1P1 (xp1, yP1) is represented by the following Expressions (Ex. 11) and (Ex. 12).

$$xp1=xc1+r1 \cdot \cos(\theta+\alpha) \quad \text{(Ex. 11)}$$

$$yp1=yc1+r1 \cdot \sin(\theta+\alpha) \quad \text{(Ex. 12)}$$

An intersection point 1P2 (xp2, yp2) is separated from a center point C1 (xc1, yc1) by a radius (r1) in a direction of an angle (θ−α). Similarly, the intersection point IP2 (xp2, yp2) is represented by the following Expressions (Ex. 13) and (Ex. 14).

$$xp2=xc1 \cdot r1 \cdot \cos(\theta-\alpha) \quad \text{(Ex. 13)}$$

$$yp2=yc1+r1 \cdot \sin(\theta-\alpha) \quad \text{(Ex. 14)}$$

An appropriate intersection point is selected from the two intersection points 1P1 and 1P2 obtained by the above expressions (Ex. 11), (Ex. 12), (Ex. 13) and (Ex. 14) as the circumference passage predicted point. The criterion for selecting the circumference passage predicted point is described in Example 21.

Next, a distance calculation in Example 22 will be described with reference to FIG. 15. As described above, in the VC2 prediction control (Step S24 in FIG. 9), the amount of change of the VC2 is calculated based on the distance between a current position of the reflection coefficient Γ and the circumference passage predicted point. In Example 22, in this situation, a length of an arc (arc of the matching movement trajectory predicted circle Cp) between the current position of the reflection coefficient Γ and the circumference passage predicted point is obtained, and the amount of change of the VC2 is calculated based on the length of the arc. With the above process, in Example 22, a prediction with high accuracy can be performed as compared with that at the time of the straight line in Example 21.

Figure 15:
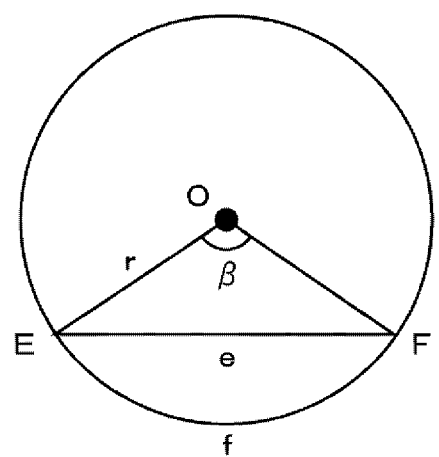
FIG. 15 is a diagram illustrating a second example of the second embodiment.

As shown in FIG. 15, if a radius (r) and a center angle (β) of the circle are given, a length (e) of a chord and a length (f) of an arc between a point E and a point F are obtained by the following expressions (Ex. 15) and (Ex. 16).

$$e=2 \cdot r \cdot \sin(\beta/2) \quad \text{(Ex. 15)}$$

$$f=r \cdot \beta \quad \text{(Ex. 16)}$$

A linear distance between the current position of the reflection coefficient Γ and the circumference passage predicted point is the length (e) of the chord. The β is obtained from the expression (Ex. 15) of the chord, and substituted into the expression (Ex. 16) to calculate the length (f) of the arc. The amount of change of the VC2 is calculated based on the length (f) of the arc.

Example 23

Next, an example of the VC1 control in Step S26 will be described as a third example (Example 23) of the second embodiment. A target point in the VC1 control is a point of (U, V)=(0, 0) which is the matching point and the target point is always kept invariant. A distance between a point on the circumference of the matching circle and the point of (U, V)=(0, 0) can be expressed by $U^2+V^2$. The movement of the reflection coefficient Γ when the VC1 control is performed basically moves along the circumference of the matching circle. Therefore, $U^2+V^2$ monotonically increases or monotonically decreases with an increase or decrease in the VC1, and there is no case in which there are multiple target points. For that reason, a feedback control such that $U^2+V^2$ approaches 0, for example, a known PID (proportional integral derivative) control may be performed.

In the control unit 20A, when the PID control is performed, since a digital control is performed by a CPU, a continuous control cannot be performed and discrete processing of a sampling system is performed. For that reason, in order to simplify the calculation, the amount (operation amount) of setting the operation is calculated in the following expression (Ex. 17).

Operation amount=$Kp$×deviation (proportional)+$Ki$×accumulation of deviation (integral)+$Kd$×difference (differential) from previous deviation $MVn=MVn-1+\Delta MVn$ $\Delta MVn$ (the amount of operation)=$Kp \times (e_n-e_{n-1})+Ki \times e_n+Kd\times((e_n-e_{n-1})-(e_{n-1}-e_{n-2}))$ (17)

where

MVn, MVn−1: current operation setting amount, previous operation setting amount

ΔMVn: current operation setting amount difference en, en−1, en−2: deviation in current time, the last time, the time before last, and Kp, Ki, Kd: gain in each operation.

The deviation from the target point is a difference of $U^2+V^2$, but an actual control is how many pF is set in the VC1. Calculation of the above expression (Ex. 17) is performed with $U^2+V^2$, and after the calculation, its setting deviation (ΔMVn) is converted into a deviation (ΔVC1) of VC1.

According to the second embodiment, at least the following advantages are achieved in addition to the advantages of the first embodiment.

(B1) A reflection coefficient acquisition process for calculating the reflection coefficients at multiple positions on the Smith chart is performed, and a predicted trajectory is acquired with the use of the multiple positions of the reflection coefficients. A circumference passage predicted point which is an intersection point of the predicted trajectory and the matching circle is acquired, and a circumference approach control of changing the VC2 so that the reflection coefficient approaches the circumference passage predicted point is performed. In addition, the VC1 is increased when an imaginary part of the circumference passage predicted point is negative, and the VC1 is decreased when the imaginary part of the circumference passage predicted point is positive. When a distance between the reflection coefficient and the matching circle falls within a predetermined first value, the VC1 is changed so that the reflection coefficient approaches zero. Thus, since the matching point approach control is performed, the misfire of the plasma can be prevented with a reduction in the impedance deterioration, and a matching time can be speeded up.

(B2) When the distance between the reflection coefficient and the matching circle becomes larger than the first value as a result of the matching point approach control, the VC2 is decreased when the reflection coefficient falls outside the matching circle, and the VC2 is increased when the reflection coefficient falls inside the matching circle. Therefore, even if the reflection coefficient deviates from the circumferential area in the matching point approach control, the reflection coefficient can be returned to the inside of the circumferential area.

(B3) Since the circumference passage predicted point is set to be the intersection point between the straight line connecting the two points of the multiple positions and the matching circle, the circumference passage predicted point can be easily obtained.

(B4) Since the circumference passage predicted point is set to be the intersection point of the matching movement trajectory predicted circle passing through three points of the multiple positions and the matching circle, a more accurate circumference passage predicted point can be obtained.

(B5) Since the circumference approach control is performed according to the length of the arc (arc of the matching movement trajectory predicted circle) connecting the position of the reflection coefficient at that time and the circumference passage predicted point in the matching movement trajectory predicted circle, the more accurate circumference approach control can be performed.

Third Embodiment

In a third embodiment (third embodiment) of the present invention, the impedance matching according to the second embodiment is further improved, and when a large load variation occurs due to plasma ignition or the like, or when the reflection coefficient Γ approaches the matching point, a more proper matching operation is performed.

A matching box 10B according to the third embodiment is configured by the matching box 10 of the first embodiment (FIG. 1) in which the capacitance calculation unit 22 is changed to a capacitance calculation unit 22B. In other words, the matching box 10B is different from that of the first embodiment and the second embodiment in the processing content of the capacitance calculation unit 22, in other words, the method of controlling the capacitance VC1 of the variable capacitance capacitor 31 and the capacitance VC2 of the variable capacitance capacitor 32 in the matching circuit 30. The other configurations of the matching box 10B according to the third embodiment are the same as those of the matching box 10 of the first embodiment.

The capacitance calculation unit 22B of the matching box 10B according to the third embodiment includes the control of the capacitance calculation unit 22A according to the second embodiment, and has the following configurations (1) and (2) added to the capacitance calculation unit 22A according to the second embodiment.

(1) When the reflection coefficient Γ has passed through the circumferential area after performing the VC2 prediction control when the reflection coefficient Γ falls outside the circumferential area, if the passage is caused by a load variation, the circumference passage predicted point is reset, and if the passage is not caused by the load variation, the VC2 is finely adjusted and returned to the circumferential area. With the above configuration, when there is a large load variation, since the circumference passage predicted point can be rapidly reset, the appropriate impedance matching can be performed.

(2) After the VC2 prediction control has been performed, if the reflection coefficient Γ does not fall within the circumferential area but falls within the target area, the VC1 control is performed while the VC2 is finely adjusted so that the reflection coefficient $\Gamma$ approaches the matching target point. With the above configuration, if the reflection coefficient $\Gamma$ does not fall within the circumferential area but falls within the target area, the impedance matching can be performed more quickly.

Figure 11:
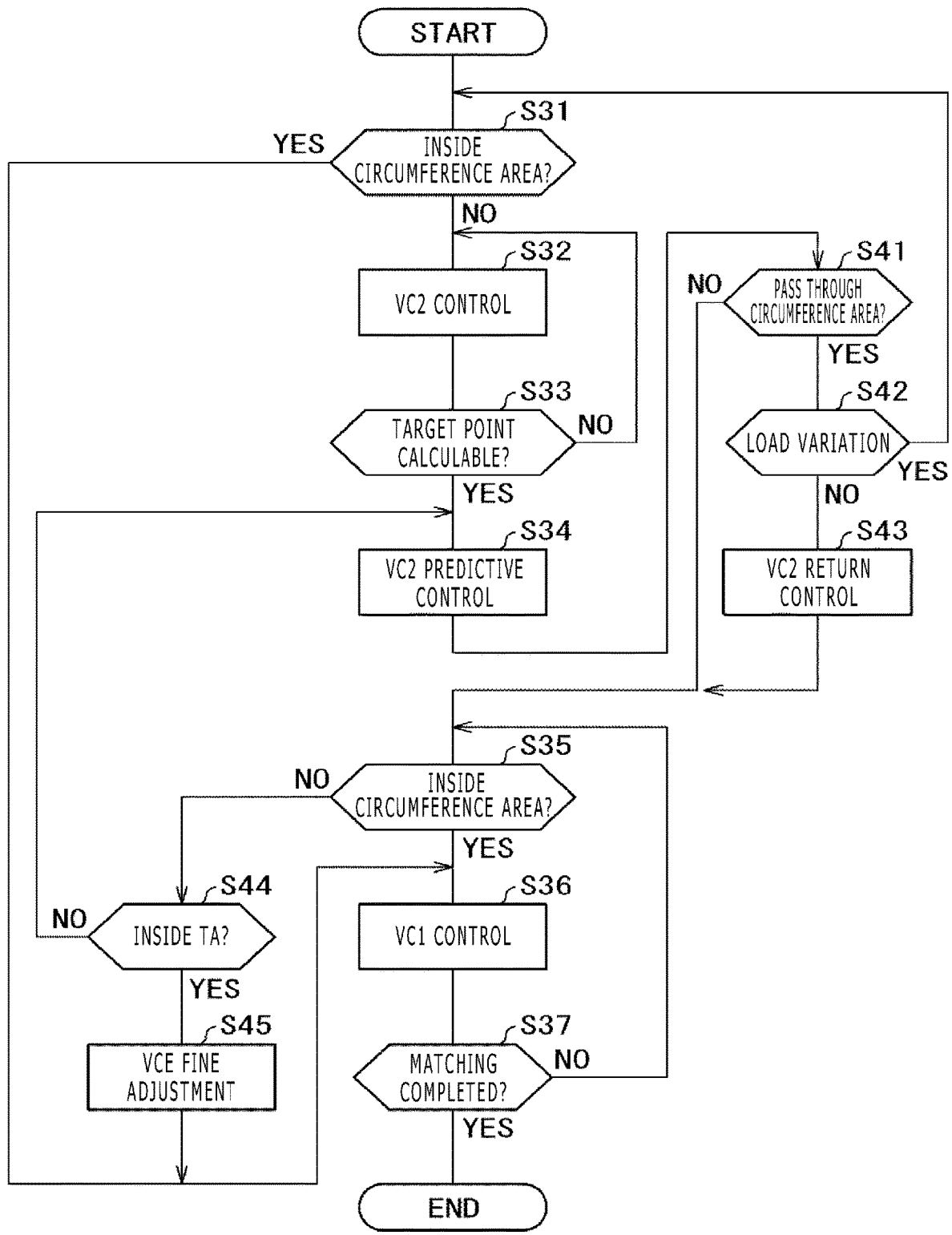
FIG. 11 is a processing flowchart of an impedance matching according to a third embodiment of the present invention.

The impedance matching process according to the third embodiment will be described with reference to FIGS. 11 and 10. FIG. 11 is a processing flowchart of the impedance matching according to the third embodiment of the present invention.

A trajectory of the reflection coefficient according to the third embodiment is approximately the same as that of the F12 and the F13 in FIG. 10 according to the second embodiment.

In the third embodiment, the reflection coefficient $\Gamma$ reaches a P1 from a Ps along an F12 under the VC2 control, and reaches a matching target point from the P1 along an F13 under the VC1 control. However, the configurations (1) and (2) described above are different from those in the second embodiment.

Hereinafter, each step in FIG. 11 will be described. The impedance matching process shown in FIG. 11 is executed in the capacitance calculation unit 22B.

(1) Determination as to whether the reflection coefficient falls within the circumferential area, or not (Step S31)

In Step S31, it is determined whether the reflection coefficient $\Gamma$ (reflection coefficient $\Gamma$ at a position Ps) at that time falls within the circumferential area, or not, as in Step S21 of the second embodiment. If the reflection coefficient $\Gamma$ falls within the circumferential area (yes in S31), the process proceeds to Step S36, and the VC1 control is performed. If the reflection coefficient $\Gamma$ does not fall within the circumferential area (No in S31), the process proceeds to Step S32.

(2) VC2 Control (Step S32)

In Step S32, the VC2 control is performed as in Step S22 of the second embodiment. In other words, the VC2 is changed such that the reflection coefficient $\Gamma$ moves from the position Ps toward the circumference of the matching circle R.

(3) Determination as to whether the Target Point can be Calculated, or Not (Step S33)

Next, it is determined whether the target point (circumference passage predicted point) in the VC2 prediction control can be calculated, or not, as in Step S23 of the second embodiment. If the target point can be calculated (yes in S33), the process proceeds to Step S34, and the VC2 prediction control is performed. If the target point cannot be calculated (No in S33), the process returns to Step S32.

(4) VC2 Prediction Control (Step S34)

The VC2 prediction control is performed as in Step S24 of the second embodiment. In other words, after the circumference passage predicted point acquisition control for acquiring the circumference passage predicted point has been performed, the circumference approach control for changing the VC2 is performed so that the reflection coefficient $\Gamma$ approaches the circumference passage predicted point.

(5) Determination of the Circumferential Area Passage (Step S41)

It is determined whether the reflection coefficient $\Gamma$ that has fallen outside the circumferential area has passed through the circumferential area, or not. If the reflection coefficient $\Gamma$ has not passed through the circumferential area (No in S41), the process goes to Step S35. If the reflection coefficient $\Gamma$ has passed through the circumferential area (Yes in S41), the process proceeds to Step S42.

(6) Determination of the Circumferential Area Passage Due to Load Variation (Step S42)

The reflection coefficient $\Gamma$ may change greatly due to a large load variation caused by a plasma ignition or the like. When the reflection coefficient $\Gamma$ greatly deviates from the predicted trajectory predicted by the VC2 prediction control (in other words, when the position (UV value) of the reflection coefficient passing through the circumferential area has deviated from the predicted trajectory by a predetermined value or more), it is determined that the reflection coefficient $\Gamma$ has passed through the circumferential area due to the load variation (Yes in S42). In that case, the process returns to Step S31, and the circumference passage predicted point is again acquired. If it is determined that the reflection coefficient $\Gamma$ has not passed through the circumferential area due to the load variation (No in S42), that is, if the position of the reflection coefficient passing through the circumferential area is less than the predetermined value from the predicted trajectory, the process proceeds to S43.

(7) VC2 Return Control (Step S43)

The VC2 is returned to a direction of the previous VC2. At this time, the amount of change of VC2 is set to a value that returns to the circumference area. The amount of change of the VC2 can be calculated based on the values of the previous VC2 and the reflection coefficient $\Gamma$, and the values of the VC2 and the reflection coefficient $\Gamma$ after having passed through the circumferential area.

As described above, in the third embodiment, in the case where the reflection coefficient has passed through the circumferential area when the circumference approach control has been performed, if the position of the reflection coefficient that has passed through the circumferential area is away from the predicted trajectory by more than the predetermined value, the circumference passage predicted point acquisition control is performed again. If the position of the reflection coefficient that has passed through the circumferential area is less than the predetermined value from the predicted trajectory, the VC2 is changed so that the reflection coefficient moves into the circumferential area. Therefore, when there is a large load variation, since the circumference passage predicted point can be reset quickly, the appropriate impedance matching can be performed.

(8) Determination as to whether the Reflection Coefficient Falls within the Circumferential Area, or Not (Step S35)

It is determined whether the reflection coefficient $\Gamma$ at that time falls within the circumferential area, or not, as in Step S25 of the second embodiment. If the reflection coefficient $\Gamma$ falls within the circumferential area (Yes in S35), the process proceeds to Step S36 and the VC1 control is performed. If the reflection coefficient $\Gamma$ does not fall within the circumferential area (no in S35), the process proceeds to Step S44.

(9) VC1 Control (Step S36)

As in Step S26 of the second embodiment, the matching operation by changing the VC1 (operation of bringing the reflection coefficient $\Gamma$ closer to the matching target point along the circumference of the matching circle R) is performed, that is, the matching point approach control is performed.

(10) Determination of Matching Completion (Step S37)

As in Step S27 of the second embodiment, it is determined whether the reflection coefficient $\Gamma$ has reached the matching target point, or not. If the reflection coefficient $\Gamma$ has reached the matching target point (Yes in S37), the impedance matching process is terminated. If the reflection coefficient $\Gamma$ has not reached the matching target point (No in S37), the process returns to Step S35. In this way, the reflection coefficient Γ is prevented from deviating from the circumferential area when changing the VC1 as in the second embodiment.

(11) Determination within the Target Area (Step S44)

As shown in FIG. 10, a target area (TA) is an area in the vicinity of the matching point in which a U direction is wider than the circumferential area. In other words, the target area is an area in which the real part of the reflection coefficient Γ is larger than the real part of the circumferential area, and which includes the matching point. For example, a radius of the target area can be set to 0.21. In Step S44, it is determined whether the reflection factor Γ falls within the target area, or not. If the reflection coefficient Γ falls within the target area (Yes in S44), the process goes to Step S45. If the reflection coefficient Γ does not fall within the target area (No in S44), the process returns to Step S34.

(12) VC2 Fine Adjustment (Step S45)

The VC2 is finely adjusted while being changed by a predetermined value. The fine adjustment brings the reflection coefficient Γ closer to the circumferential area. After Step S45, the VC1 control (S36) is performed.

As described above, in the third embodiment, after the circumference approach control (S34) has been performed, if there is the reflection coefficient Γ outside the circumferential area and the reflection coefficient Γ falls within the target area, the VC2 is changed (S45), and thereafter the matching point approach control (S36) is performed. If the reflection coefficient Γ does not fall within the target area, the circumference approach control (S34) is performed. With the above process, if the reflection coefficient Γ does not fall within the circumferential area, but falls within the target area (Yes in S44), the impedance matching can be performed more quickly.

According to the third embodiment, at least the following advantages are achieved in addition to the advantages of the first embodiment and the second embodiment.

(C1) When the reflection coefficient has passed through the circumferential area when the circumference approach control is performed in a state in which there is a reflection coefficient outside the circumferential area, if the position of the reflection coefficient that has passed through the circumferential area is away from the predicted trajectory by a predetermined second value, the process proceeds to a reflection coefficient calculation process. If the position of the reflection coefficient that has passed through the circumferential area is less than the predetermined second value from the predicted trajectory, the VC2 is changed so that the reflection coefficient moves into the peripheral area, and the control is shifted to the matching point approach control. Therefore, even if even when a large load variation occurs, the circumference passage predicted point can be quickly reset and the appropriate impedance matching can be performed.

(C2) When there is the reflection coefficient outside the circumferential area and the reflection coefficient falls within the target area after the circumference approach control has been performed, the matching point approach control is performed after the VC2 has been changed. If there is no reflection coefficient in the target area, the circumference approach control is performed. Therefore, the impedance matching can be performed more quickly if there is the reflection coefficient in the target area.

Fourth Embodiment

In the second and third embodiments, the VC2 is changed and the VC1 is finely adjusted in the VC2 prediction control so that the reflection coefficient Γ is moved onto the circumference of the matching circle while the deterioration of the input impedance of the matching box is prevented.

However, when the sensitivity of the input impedance of the matching box with respect to the amount of change of the VC2 is high (that is, when the sensitivity of the reflection coefficient Γ with respect to the amount of change of the VC2 is high), the deterioration of the input impedance of the matching box may not be improved by fine adjustment of the VC1. When the deterioration of impedance occurs during matching at the time of plasma ignition or the like, there is a risk that the plasma may be misfired.

The matching box according to the fourth embodiment of the present invention solves the above problem and provides a technique capable of preventing an input impedance of the matching box from being deteriorated even when handling is difficult in the matching operation of the second and third embodiments.

A matching box 10C according to the fourth embodiment is different from the matching box 10A of the second embodiment in the processing content of the capacitance calculation unit 22A, in other words, the method of controlling the capacitance VC1 of the variable capacitance capacitor 31 and the capacitance VC2 of the variable capacitance capacitor 32 in the matching circuit 30. The other configurations of the matching box 10C according to the fourth embodiment are the same as those of the matching box 10A of the second embodiment. In other words, the capacitance calculation unit 22C of the matching box 10C according to the fourth embodiment includes the control of the capacitance calculation unit 22A according to the second embodiment, and mainly has the following configurations (1) to (3) added to the capacitance calculation unit 22A according to the second embodiment. The following configurations (1) to (3) are an outline of the fourth embodiment. The details will be described later with reference to FIG. 16.

(1) The capacitance calculation unit 22C according to the fourth embodiment acquires a circumference passage predicted point that is an intersection point between a predicted trajectory (predicted trajectory when the VC2 is changed) of the reflection coefficient Γ and the circumference of the matching circle on the Smith chart by calculation. The capacitance calculation unit 22C further acquires an intersection point (V zero straight line passage predicted point) between the predicted trajectory of the reflection coefficient Γ and a straight line of V=0 by calculation. The capacitance calculation unit 22C selects whether a circumference approach control aiming for the circumference passage predicted point is performed, or a V zero straight line approach control aiming for the V zero straight line passage predicted point is performed, in the VC2 predicted control, on the basis of the calculation results of those intersection points. In other words, the capacitance calculation unit 22C selects a path with a small deterioration of the input impedance of the matching box 10C based on the calculation results.

(2) When the circumference passage predicted point is far from the matching point (the center of the Smith chart) as compared with the position of the current reflection coefficient Γ on the Smith chart, that is, a U value of the circumference passage predicted point is larger than the U value of the current reflection coefficient Γ (For example, when U>0.4), the capacitance calculation unit 22C selects the V zero straight line passage predicted point as an arrival target, and performs the circumference approach control, that is, the VC2 prediction control described in the second embodiment (S24 in FIG. 9).

(3) The VC2 prediction control is performed with the V zero straight line passage predicted point as the arrival target, and upon reaching the arrival target, the VC1 is changed, to thereby perform a V zero straight line separation control for separating the reflection coefficient Γ from the V=0 straight line. At that time, the VC1 is changed in a direction in which the reflection coefficient Γ approaches the matching point. After the position of the reflection coefficient Γ is separated from the V zero straight line by a predetermined value, for example, until the V value of the reflection coefficient Γ satisfies about V<—0.3 under the V zero straight line separation control, the control again shifts to the VC2 prediction control.

As described above, the control unit 20C alternately performs the circumference approach control (control of the VC2) and the V zero straight line separation control (control of the VC1), as a result of which even when a variation in the input impedance of the matching box 10C is critical, the deterioration of the input impedance of the matching box 10C can be reduced, and the misfire of the plasma can be prevented.

Figure 16:
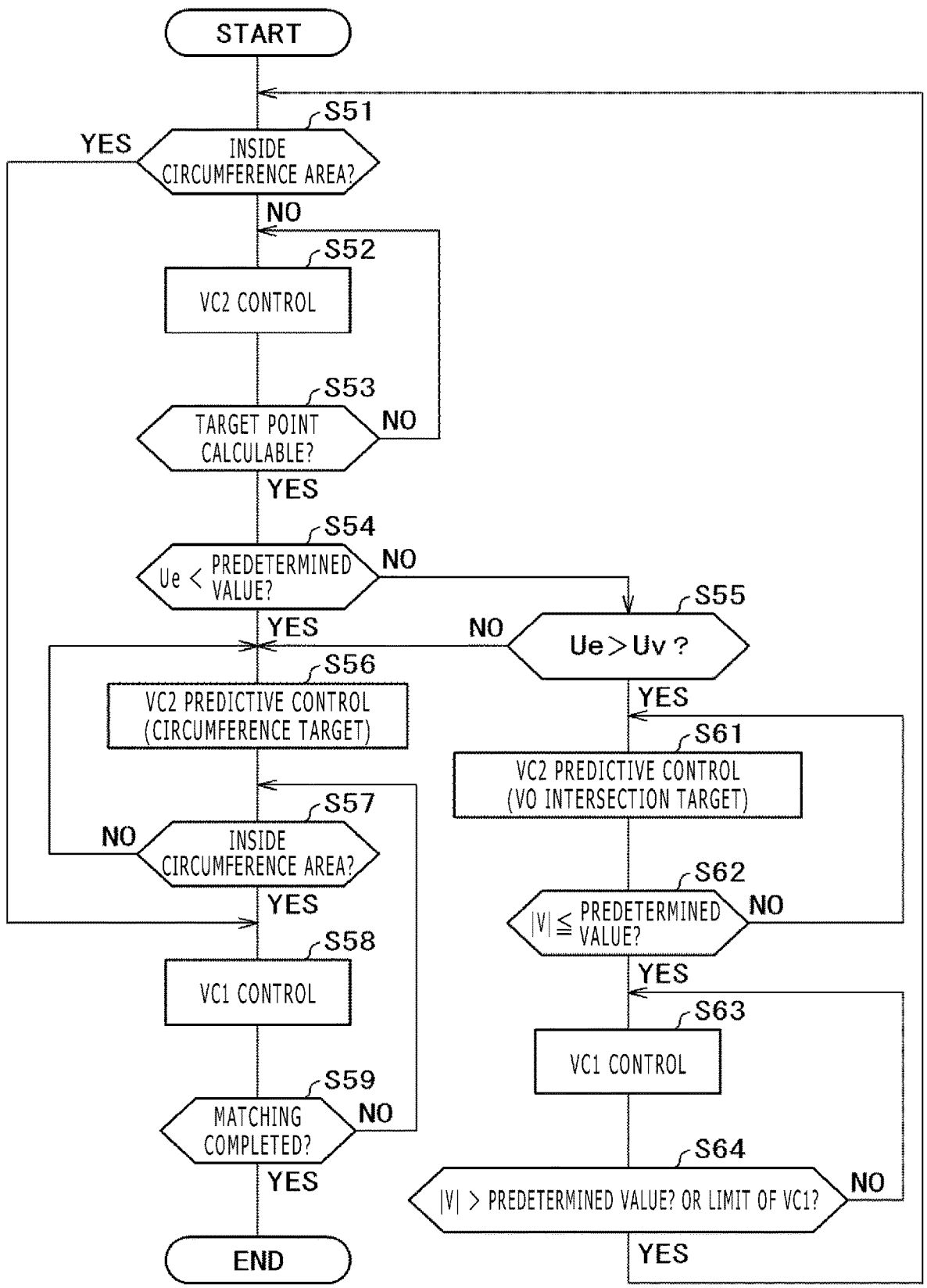
FIG. 16 is a processing flowchart of an impedance matching according to a fourth embodiment of the present invention.

The impedance matching process according to the fourth embodiment will be described with reference to FIGS. 16 and 17. FIG. 16 is a flowchart of the impedance matching process according to the fourth embodiment. The impedance matching process shown in FIG. 16 is executed in the capacitance calculation unit 22C.

Figure 17:
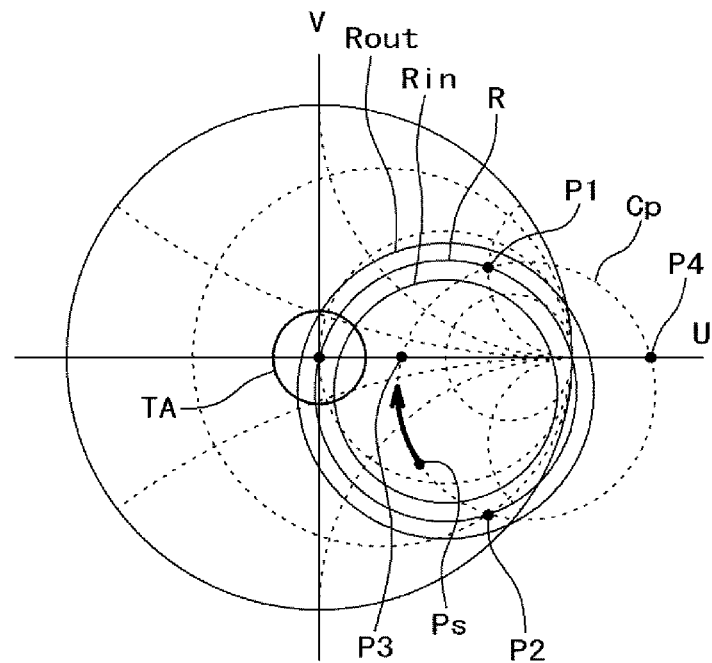
FIG. 17 is a diagram illustrating the selection of circumference passage predicted points in a VC2 prediction control according to the fourth embodiment of the present invention.

FIG. 17 is a Smith chart describing the selection of the arrival target in the VC2 prediction control. Reference symbol R is a matching circle. Reference symbol Cp is a matching movement trajectory predicted circle, which is calculated from three reflection coefficient calculation points on the Smith chart. In other words, the Cp is a circle predicted as the trajectory of the reflection coefficient Γ on the Smith chart when the prediction control of the VC2 is performed.

Reference numerals P1 and P2 are intersection points (circumference passage predicted points) between the matching circle R and the matching movement trajectory predicted circle Cp. Reference numerals P3 and P4 are intersection points (V zero straight line passage predicted points) between the straight line of V=0 and the matching movement trajectory predicted circle Cp. Reference numeral Ps is the position of the reflection coefficient Γ at a certain time (for example, a start time of the impedance matching process). The circumferential area is an area falling within a predetermined distance range from the circumference of the matching circle R, which is an area between a circumference of a circle Rin inside the matching circle R and a circumference of a circle Rout outside the matching circle R.

Hereinafter, the respective steps in FIG. 16 will be described below.

(1) Determination as to whether the reflection coefficient Γ falls within the circumferential area, or not (Step S51)

In Step S51, it is determined whether the reflection coefficient Γ (reflection coefficient Γ in the position Ps) at that time falls within the circumferential area, or not, as in Step S21 in the second embodiment. If the reflection coefficient Γ falls within the circumferential area (Yes in S51), the process proceeds to Step S58 to perform the VC1 control. If the reflection coefficient Γ does not fall within the circumferential area (No in S51), the process proceeds to Step S52.

(2) VC2 Control (Step S52)

In Step S52, the VC2 control is performed as in Step S22 of the second embodiment. In other words, the VC2 is changed so that the reflection coefficient Γ approaches the circumference of the matching circle R from the position Ps. In an example of FIG. 17, since the position Ps is located inside the matching circle R, the VC2 is increased.

(3) Determination as to whether the Target Point can be Calculated, or Not (Step S53)

Next, it is determined whether the VC2 prediction control is enabled, or not, as in Step S23 of the second embodiment. In other words, it is determined whether the target point (circumference passage predicted point) in the VC2 prediction control can be calculated, or not. If the circumference passage predicted point can be calculated (Yes in S53), the process proceeds to Step S54, and the U value (Ue) at the circumference passage predicted point is determined. If the circumference passage predicted point cannot be calculated (No in S53), the process returns to Step S52.

As described in the second embodiment, in order to obtain the circumference passage predicted point, two or more points (reflection coefficient calculation points) for calculating the reflection coefficient Γ on the UV coordinate are required. When the two reflection coefficient calculation point are provided, as described in Example 21 of the second embodiment, the intersection point of the straight line connecting the two reflection coefficient calculation points and the matching circle R is the circumference passage predicted point. When the above Step S52 is implemented once (that is, the VC2 is changed once), two reflection coefficient calculation points can be obtained at the reflection coefficient calculation point before the VC2 changes and the reflection coefficient calculation point after the VC2 changes.

In the case of three reflection coefficient calculation points, as described in Example 22 of the second embodiment, the intersection point of the circle (matching movement trajectory predicted circle Cp) calculated from the three reflection coefficient calculation points and the matching circle R can be set as the circumference passage predicted point. In that case, the above Step S52 is executed twice. In the process of FIG. 16, an example in which the intersection point of the matching movement trajectory predicted circle Cp and the matching circle R is set as the circumference passage predicted point will be described.

(4) Determination of the U Value at the Circumference Passage Predicted Point (Step S54)

In Step S54, it is determined whether an Ue (that is, the circumference real part which is the real part of the circumference passage predicted point P1) is smaller than a predetermined first value (for example, U=0.4), or not. If the Ue is smaller than the first value (Yes in S54), the process goes to Step S56 and the VC2 prediction control (circumference approach control) with the circumference passage predicted point P1 as the arrival target is performed. If the Ue is equal to or larger than the first value (No in S54), the process proceeds to Step S55 and the Ue and a Uv are compared with each other. The Uv is a U value (that is, the V zero real part which is the real part of a V zero straight light passage predicted point P3) at the intersection point (V zero straight line passage predicted point) P3 between the straight line with V=0 and the matching movement trajectory predicted circle Cp.

In this case, the VC2 prediction control with the circumference passage predicted point P1 as the arrival target means that the VC2 is changed until reaching the vicinity of the circumference passage predicted point P1, and the VC1 is increased or decreased according to the V coordinated at the circumference passage predicted point P1 when the VC2 is changed as described in the second embodiment. In an example of FIG. 17, since the V coordinate of the circumference passage predicted point P1 is positive, the VC1 is decreased (refer to the description of Step S24 in the second embodiment).

(5) Comparison between the Ue and the Uv (Step S55)

In Step S55, it is determined whether the Ue is larger than the Uv, or not. If the Ue is larger than Uv (yes in S55), the process goes to Step S61, and the VC2 prediction control with the V zero straight line passage predicted point P3 as the arrival target is performed. If the Ue is equal to or smaller than the Uv (No in S55), the process proceeds to Step S56, and the VC2 prediction control with the circumference passage predicted point P1 as the arrival target is performed.

In this example, the VC2 prediction control with the V zero straight line passage predicted point P3 as the arrival target means that the VC2 is changed until reaching the vicinity of the V zero straight line passage predicted point P3, and the VC1 is increased or decreased according to the V coordinated at the circumference passage predicted point P1 when the VC2 is changed. In the example of FIG. 17, since the V coordinate of the circumference passage predicted point P1 is positive, the VC1 is decreased.

As described above, when the Ue is smaller than the first value (Yes in S54), since the possibility of the reflection coefficient Γ moves away from the matching point is small even if the change of the VC2 is repeated, the VC2 prediction control (S56) with the circumference passage predicted point P1 as the arrival target is performed as in the second embodiment.

Moreover, when the Ue is equal to or larger than the first value but equal to or smaller than the Uv (No in S55), the possibility that the reflection coefficient Γ moves away from the matching point is still small even when the change of the VC2 is repeated, the VC2 prediction control (S56) with the circumference passage predicted point P1 as the arrival target is performed as in the second embodiment.

If the Ue is equal to or larger than the first value and larger than the Uv (Yes in S55), since the possibility that the reflection coefficient Γ moves away from the matching point is large when the change of the VC2 is repeated, the VC2 prediction control (S61) with the V zero straight line passage predicted point P3 as the arrival target (S61) is performed.

Two circumference passage predicted points (P1, P2) and two V zero straight line passage predicted points (P3, P4) are calculated, but in the selection of which of those predicted points is to set as the arrival target, the predicted point capable of reducing the deterioration of the input impedance of the matching box 10C is selected based on the position of the reflection coefficient Γ on the Smith chart at that time is selected. In other words, one circumference passage predicted point or V zero straight line passage predicted point is set as the arrival target based on the reflection coefficient Γ at that time, and the respective U values and V values of the circumference passage predicted point (P1, P2) and the V zero straight line passage predicted point (P3, P4).

Specifically, in the Smith chart, when viewed from the position of the reflection coefficient Γ at that time, the intersection point in the forward direction of the trajectory of the reflection coefficient Γ during the matching operation is selected as the arrival target. In other words, a circumference passage predicted point having a polarity opposite to that of the V value of the reflection coefficient Γ at that time, or a V zero straight line passage predicted point on the matching movement trajectory predicted circle Cp reaching the circumference passage predicted point is selected as the arrival target.

For example, when FIG. 17, the circumference passage predicted point P1 or the V zero straight line passage predicted point P3 is set as the arrival target based on the U value and the V value of the position Ps of the reflection coefficient Γ at that time, the U value and the V value of the circumference passage predicted point (P1, P2), and the U value and the V value of the V zero straight line passage predicted point (P3, P4).

Specifically, when FIG. 17, since the V value of the position Ps of the reflection coefficient Γ is negative, the circumference passage predicted point P1 whose V value is positive is determined as the arrival target. Alternatively, the V zero straight line passage predicted point P3 on the matching movement trajectory predicted circle Cp reaching the circumference passage predicted point P1 is determined as the arrival target.

(6) The VC2 Prediction Control with the Circumference Passage Predicted Point as the Arrival Target (Step S56)

As in Step S24 of the second embodiment, the circumference approach control for changing the VC2 so that the reflection coefficient Γ approaches the circumference passage predicted point is performed. At that time, as described in the second embodiment, the circumference passage predicted point is acquired and the VC1 is finely adjusted based on the circumference passage predicted point. More specifically, when the V coordinate of the circumference passage predicted point is negative, the VC1 is finely adjusted so that the VC1 increases, and when the V coordinate of the circumference passage predicted point is positive, the VC1 is finely adjusted so that the VC1 decreases. In the example of FIG. 17, since the V coordinate of the circumference passage predicted point P1 is positive, the VC1 is decreased.

(7) Determination as to whether the Reflection Coefficient Γ Falls within the Circumferential Area, or Not (Step S57)

After the VC2 has been changed in Step S56, it is determined whether the changed reflection coefficient Γ falls within the circumferential area, or not. If the reflection coefficient Γ falls within the circumferential area (Yes in S57), the process proceeds to S58, and the VC1 control is performed. If the reflection coefficient Γ does not fall within the circumferential area (No in S57), the process returns to Step S56.

(8) The VC1 Control (Step S58)

As in Step S26 of the second embodiment, the matching operation (the reflection coefficient Γ approaches the matching target point along the circumference of the matching circle R) caused by the VC1 change, that is, the matching point approach control is performed. In the example of FIG. 17, the VC1 is decreased.

(9) Determination of the Matching Completion (Step S59)

It is determined whether the reflection coefficient Γ has reached the matching target point, or not. If the reflection coefficient Γ has reached the matching target point (Yes in S59), the impedance matching process is terminated. If the reflection coefficient Γ has not reached the matching target point (No in S59), the process returns to Step S57. In this way, the reflection coefficient reflection coefficient Γ is prevented from deviating from the circumferential area when the VC1 is changed. As in the second embodiment, when the reflection coefficient Γ deviates outside the circumferential area, the VC2 is decreased, and if the reflection coefficient F falls within the circumferential area, the VC2 is increased.

(10) The VC2 prediction Control with the V Zero Straight Line Passage Predicted Point as the Arrival Target (Step S61)

The V zero straight line approach control is performed to change the VC2 so that the reflection coefficient Γ approaches the V zero straight line passage predicted point.

At that time, the VC1 is finely adjusted. In the example of FIG. 17, since the V coordinate of the circumference passage predicted point P1 is positive, the VC1 is decreased.

(11) Determination as to whether |V| is Equal to or Less than a Predetermined Value, or Not (Step S62)

After Step S61 has been performed, it is determined whether |V1 (absolute value of V) of the reflection coefficient Γ at that time is equal to or less than a predetermined second value, or not, that is, falls within a predetermined range from the straight line of V=0, or not (for example, the V value of the reflection coefficient Γ falls within V=0±0.05). If |V1 of the reflection coefficient Γ is equal to or less than the second value (Yes in S62), the process proceeds to Step S63, and the VC1 control is performed. If |V1 of the reflection coefficient Γ is less than the second value (No in S62), the process returns to Step S61.

(12) The VC1 Control (Step S63)

The VC1 is changed so that |V1 of the reflection coefficient Γ becomes larger than a predetermined third value (for example, so that the V value of the reflection coefficient Γ becomes smaller than V=−0.3) and the reflection coefficient Γ approaches the matching point. In other words, the V zero straight line separation control is performed to change the VC1 so that the reflection coefficient Γ is separated from the V zero straight line by more than a predetermined value, and approaches the matching point. In the example of FIG. 17, the VC1 is decreased (refer to FIG. 4).

(13) Determination as to whether |V| is more than the Third Value, or Not (Step S64)

After Step S63 has been performed, it is determined whether |V1 (the absolute value of V) of the reflection coefficient Γ at that time is more than the third value, or not, that is, whether the reflection coefficient Γ falls outside a predetermined range from the straight line of V=0, or not (for example, the V value of the reflection coefficient Γ is smaller than V=−0.3), or not, or whether the VC1 at that time is a change limit value (for example, the VC1 is a minimum value), or not. If |V1 of the reflection coefficient Γ is larger than the third value, or if the VC1 is the change limit value (Yes in S64), the process returns to Step S51. If |V1 of the reflection coefficient Γ is equal to or less than the third value and the VC1 is not the change limit value (No in S64), the process returns to Step S63, and the VC1 control is performed.

In this way, in the fourth embodiment, when the Ue is equal to or more than the first value and larger than the Uv (yes in S55), the V zero straight line approach control (S61) with the V zero straight line passage predicted point as the arrival target and the V zero straight line separation control (S63) are performed. Therefore, when the change of the VC2 is repeated as in the second embodiment, it is possible to prevent the reflection coefficient Γ from moving away from the matching point and deteriorating the input impedance of the matching box.

In addition, in the fourth embodiment, when the Ue is smaller than the first value (Yes in S54) or when the Ue is equal to or more than the first value but equal to or less than the Uv (No in S55), since the circumference approach control with the circumference passage predicted point as the arrival target is performed as in the second embodiment, the same advantages as those in the second embodiment is exerted. In other words, the misfire of the plasma caused by preventing the deterioration of the impedance can be prevented, and the matching time can be speeded up.

In the example of FIG. 16, it is determined whether the Ue is smaller than the first value, or not, in Step S54, and it is determined whether the Ue is larger than the Uv, or not, in Step S55. However, a configuration in which any one of Steps S54 and S55 is omitted can be performed. Even with such a configuration, the advantages of the fourth embodiment can be obtained to some extent.

When Step S54 is omitted, Step S55 is executed after Step S53. When the Ue is larger than the Uv in Step S55, the process proceeds to Step S61, and in the case where the Ue is equal to or less than the Uv, the process proceeds to S56.

When Step S55 is omitted, if the Ue is smaller than the first value in Step S54, the process proceeds to Step S56. If the Ue is equal to or more than the first value, the process proceeds to Step S61.

In Steps S56 and S61 described above, the VC1 is finely adjusted at the time of changing the VC2. Alternatively, the VC1 may not be finely adjusted. Even with such a configuration, the advantage of the fourth embodiment can be exerted.

Example 41

Figure 18:
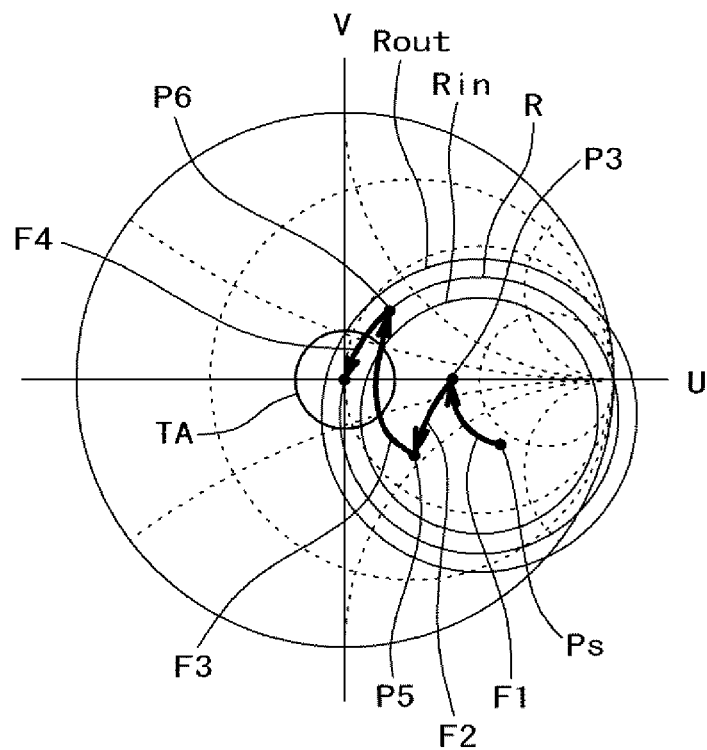
FIG. 18 is a diagram illustrating a first example according to the fourth embodiment of the present invention.

A first example (Example 41) of the impedance matching process in the fourth embodiment will be described with reference to FIG. 18. FIG. 18 is a Smith chart showing the impedance matching process according to Example 41.

As shown in FIG. 18, Steps S51 to S55 in FIG. 16 are first executed at the position Ps. In an example of FIG. 18, in Step S54, since it is determined that the Ue (the U value of the circumference passage predicted point) at the position Ps is equal to or more than a predetermined value (for example, U=0.4) (No in Step S54 of FIG. 16), the process proceeds to Step S55. In Step S55, since it is determined that the Ue (the U value of the circumference passage predicted point) at the position Ps is larger than the Uv (the U value at the V zero straight line passage predicted point P3) at the position Ps, the process goes to Step S61 in which the V zero straight line approach control (F1 in FIG. 18) with the V zero straight line passage predicted point P3 as the arrival target is performed, and the VC2 is changed. In the example of FIG. 18, the VC2 is increased.

When it is determined that the reflection coefficient Γ has reached the vicinity of the intersection point P3 during the execution of the V zero straight line approach control F1 (Yes in Step S62 of FIG. 16), the process moves to Step S63 in FIG. 16, and the V zero straight line separation control (F2 in FIG. 18) is performed to change the VC1. At that time, in the example of FIG. 18, the VC1 is decreased so that the reflection coefficient Γ approaches the matching point. When the VC1 is increased in the example of FIG. 18, the reflection coefficient Γ moves in a direction approximately opposite to that of the F2, that is, the reflection coefficient Γ departs from the V=0 straight line, but also moves away from the matching point.

If it is determined that |V| of the reflection coefficient Γ is larger than the predetermined value during the execution of the V zero straight line separation control F2 (Yes in Step S64 of FIG. 16), the process proceeds to Step S51 in FIG. 16, and Steps S51 to S54 are executed. In Step S54, since it is determined that the Ue (the U value of the circumference passage predicted point) at the position P5 is smaller than a predetermined value (for example, U=0.4) (Yes in Step S54 of FIG. 16), the process goes to Step S56 where the circumference approach control (F3 in FIG. 18) with the circumference passage predicted point at the position P5 as the arrival target is performed to change the VC2. In the example of FIG. 18, the VC2 is increased.

When it is determined that the reflection coefficient Γ falls within the circumferential area during the execution of the circumference approach control F3 (Yes in Step S57 of FIG. 16), the process proceeds to Step S58 in FIG. 16, and the matching point approach control (F4 in FIG. 18) is performed to change the VC1. In the example of FIG. 18, the VC1 is decreased. During the execution of the matching point approach control F4, the reflection coefficient Γ reaches the matching target point and the matching process is completed (Yes in Step S59 of FIG. 16).

Figure 19:
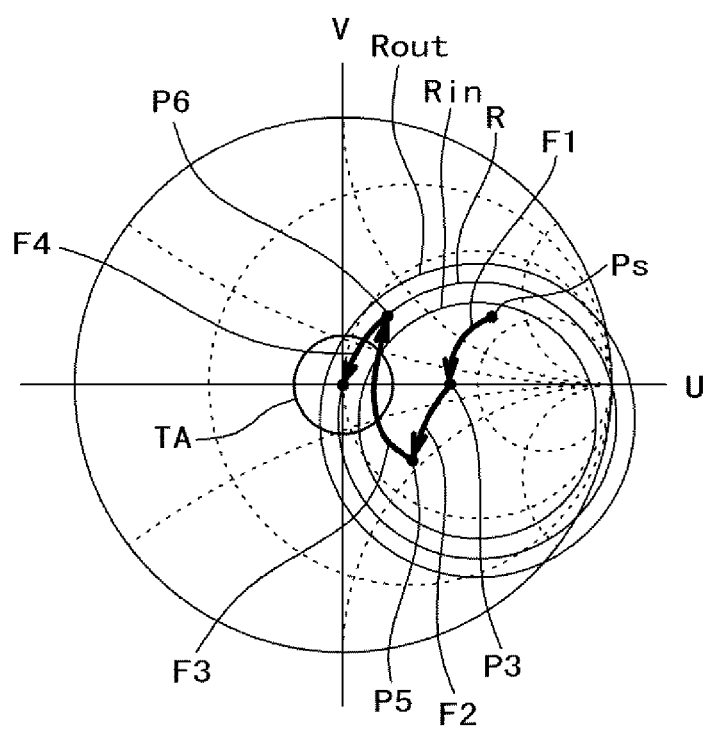
FIG. 19 is a diagram illustrating another example according to the fourth embodiment of the present invention.

In Example 41 described above, the case where the start position Ps of the matching process is located below the straight line of V=0 on the Smith chart, that is, the case where the V value of the position Ps is negative has been described. When the V value of the position Ps is positive, the matching process can be performed in the same manner as in Example 41. In that case, matching paths (F1 to F4) shown in FIG. 19 are obtained. In this case as well, in the VC1 control of F2, the VC1 is decreased so that the reflection coefficient Γ approaches the matching point.

According to the fourth embodiment, at least the following advantages are obtained in addition to the advantages of the first to third embodiments.

(D1) The predicted trajectory is acquired with the use of the multiple positions of the reflection coefficient, the circumference passage predicted point which is an intersection point of the predicted trajectory and the matching circle is acquired, and the V zero straight line passage predicted point that is the intersection point of the V zero straight line and the predicted trajectory is acquired. The selection of whether to perform the V zero straight line approach control or perform the circumference approach control is performed based on the value of the real part (circumference real part) of the circumference passage predicted point. In the case of performing the V zero straight line approach control, the VC2 is changed so that the reflection coefficient approaches the V zero straight line passage predicted point, and thereafter the V zero straight line separation control is performed to change the VC1 so that the reflection coefficient greatly deviates from the V zero straight line by more than the first value. In the case of performing the circumference approach control, the VC2 is changed so that the reflection coefficient approaches the circumference passage predicted point, and the matching point approach control is performed to change the VC1 so that the reflection coefficient approaches zero when a distance between the reflection coefficient and the matching circle falls the second value. Therefore, when the sensitivity of the input impedance of the matching box is high, the deterioration of the input impedance of the matching box can be prevented.

(D2) When the selection of whether the V zero straight line approach control is performed or the circumference approach control is performed is performed, if the circumference real part is equal to or more than the third value, the V zero straight line approach control is performed, and if the circumference real part is less than the third value, the circumference approach control is performed, as a result of which the selection can be appropriately performed.

(D3) When the selection is performed, if the circumference real part is more than the real part (V zero real part) of the V zero straight line passage predicted point is more than the real part (V zero real part) of the V zero straight line passage predicted point, the V zero straight line approach control is performed. If the circumference real part is equal to or less than the V zero real part, the circumference approach control is performed. As a result, the selection can be appropriately performed.

(D4) When the selection is performed, if the circumference real part is equal to or more than the third value and more than the V zero real part, the V zero straight line approach control is performed. If the circumference real part is less than the third value or the circumference real part is equal to or more than the third value and equal to or less than the V zero real part, the circumference approach control is performed. As a result, the selection can be performed appropriately.

It should be noted that the present invention is not limited to the embodiments and examples described above, and can be variously changed without departing from the spirit of the present invention.

The configurations of each embodiment described above can be appropriately applied to other embodiments. For example, the determination and processing of the circumferential area passage caused by the load variation (S41 to S43) and the determination and processing within the target area (S44 to S45) in the third embodiment can be also applied to the fourth embodiment.

In each of the embodiments described above, the information on the circle corresponding to the transmission line 35 is configured to be stored in the storage unit 25 in advance, but instead of being stored in advance in the storage unit 25, the control unit may calculate the information on the circle with the use of (Ex. 4) every time the information on the circle is required.

REFERENCE SIGNS LIST

2: RF Generator,
3: plasma processing device,
10, 10A, 10B, and 10C: matching box,
11: directional coupler,
20, 20A, and 20C: control unit,
21: reflection coefficient calculation unit,
22, 22A, 22B, and 22C: capacitance calculation unit,
23: capacitance setting unit,
25: storage unit,
30: matching circuit,
30a: input terminal,
30b: output terminal,
31 and 32: variable capacitance capacitor,
31a: control terminal,
32a: control terminal,
33: inductance,
35 and 36: transmission line,
100: matching box,
120: control unit,
122: capacitance calculation unit,
VC1: capacitance of variable capacitance capacitor 31,
VC2: capacitance of variable capacitance capacitor 32

The invention claimed is:

1. A matching box comprising:
   a directional coupler that detects a traveling wave and a reflected wave;
   a matching circuit that includes an input terminal connected to the directional coupler, an output terminal, a first variable capacitance capacitor having one end connected to the input terminal through a first transmission line and the other end grounded, a second variable capacitance capacitor having one end connected to the output terminal through a second transmission line and the other end grounded, and an inductance having one end connected to the one end of the first variable capacitance capacitor and the other end connected to the one end of the second variable capacitance capacitor; and a control unit that controls a capacitance value of the first variable capacitance capacitor and a capacitance value of the second variable capacitance capacitor on the basis of the traveling wave and the reflected wave detected by the directional coupler, wherein the control unit calculates at least a first, second, and third reflection coefficient with at least three respective positions on a Smith chart, the first, second, and third reflection coefficients providing a predicted path to intersect a previously calculated and stored matching circle on the Smith chart, and acquiring a circumference passage predicted point which is an intersecting point between the predicted path and the matching circle;

the control unit calculates at least a first, second, and third reflection coefficient with at least three respective positions on a Smith chart, the first, second, and third reflection coefficients providing a predicted path to intersect a previously calculated and stored matching circle on the Smith chart, and acquiring a circumference passage predicted point which is an intersecting point between the predicted path and the matching circle;

the control unit performs a matching point approach control for fixing the capacitance value of the second variable capacitance capacitor and changing the capacitance value of the first variable capacitance capacitor to cause the the measured reflection coefficient to follow another path on the smith chart to approach zero when distances between the measured reflection coefficient and the matching circle fall within a predetermined first value, wherein the capacitance value of the first variable capacitance capacitor is increased when the imaginary part of the circumference passage predicted point is negative, and the capacitance value of the first variable capacitance capacitor is decreased when the imaginary part of the circumference passage predicted point is positive.

2. A matching box comprising:

a directional coupler that detects a traveling wave and a reflected wave; a matching circuit that includes an input terminal connected to the directional coupler, an output terminal, a first variable capacitance capacitor having one end connected to the input terminal through a first transmission line and the other end grounded, a second variable capacitance capacitor having one end connected to the output terminal through a second transmission line and the other end grounded, and an inductance having one end connected to the one end of the first variable capacitance capacitor and the other end connected to the one end of the second variable capacitance capacitor; and a control unit that controls a capacitance value of the first variable capacitance capacitor and a capacitance value of the second variable capacitance capacitor on the basis of the traveling wave and the reflected wave detected by the directional coupler, wherein the control unit calculates at least a first, second, and third reflection coefficient with at least three respective positions on a Smith chart, the first, second, and third reflection coefficients providing a predicted path to intersect a previously calculated and stored matching circle on the Smith chart, and acquiring a circumference passage predicted point which is an intersecting point between the predicted path and the matching circle;

the control unit performs a circumference approach control by fixing the capacitance value of the first variable capacitance capacitor and changing the capacitance value of the second variable capacitance capacitor to cause a measured reflection coefficient to approach the circumference passage predicted point along a length of a circular arc of the predicted path; and the control unit performs a matching point approach control for fixing the capacitance value of the second variable capacitance capacitor and changing the capacitance value of the first variable capacitance capacitor to cause the measured reflection coefficient to follow another path to approach zero when distances between the measured reflection coefficient and the matching circle fall within a predetermined first value, wherein the capacitance value of the first variable capacitance capacitor is increased when the imaginary part of the circumference passage predicted point is negative, and the capacitance value of the first variable capacitance capacitor is decreased when the imaginary part of the circumference passage predicted point is positive, wherein once the circumference approach control causes the measured reflection coefficient to pass through a measured circumferential area defined by first and second circles concentric with the matching circle and separated to the outside and the inside, respectively, of the matching circle by a first value, the control unit restarts the process if the measured reflection coefficient is separated from the predicted path by a predetermined second value or more, and the control unit changes the capacitance value of the second variable capacitance capacitor to cause the reflection coefficient to move within the circumferential area and shifts to the matching point approach control if the position of the measured reflection coefficient is separated from the predicted path by less than the second value.

3. A matching box comprising:

a directional coupler that detects a traveling wave and a reflected wave;

a matching circuit that includes an input terminal connected to the directional coupler, an output terminal, a first variable capacitance capacitor having one end connected to the input terminal through a first transmission line and the other end grounded, a second variable capacitance capacitor having one end connected to the output terminal through a second transmission line and the other end grounded, and an inductance having one end connected to the one end of the first variable capacitance capacitor and the other end connected to the one end of the second variable capacitance capacitor; and a control unit that controls a capacitance value of the first variable capacitance capacitor and a capacitance value of the second variable capacitance capacitor on the basis of the traveling wave and the reflected wave detected by the directional coupler, wherein the control unit calculates at least a first, second, and third reflection coefficient with at least three respective positions on a Smith chart, the first, second, and third reflection coefficients providing a predicted path to intersect a previously calculated and stored matching circle on the Smith chart, and acquiring a circumference passage predicted point which is an intersecting point between the predicted path and the matching circle;

the control unit performs a circumference approach control by fixing the capacitance value of the first variable capacitance capacitor and changing the capacitance value of the second variable capacitance capacitor to cause a measured reflection coefficient to approach the circumference passage predicted point along a length of a circular arc of the predicted path; and the control unit performs a matching point approach control for fixing the capacitance value of the second variable capacitance capacitor and changing the capacitance value of the first variable capacitance capacitor to cause the measured reflection coefficient to follow another path to approach zero when distances between the measured reflection coefficient and the matching circle fall within a predetermined first value, wherein the capacitance value of the first variable capacitance capacitor is increased when the imaginary part of the circumference passage predicted point is negative, and the capacitance value of the first variable capacitance capacitor is decreased when the imaginary part of the circumference passage predicted point is positive, wherein after the control unit has performed the circumference approach control and changed the capacitance value of the second variable capacitance capacitor, if the real part of a measured reflection coefficient is greater than a real part of the circumferential area and the reflection coefficient falls within a target area of the Smith chart including the matching point, the control unit performs the matching point approach control, and if the measured reflection coefficient is not in the target area, the control unit performs the circumference approach control.

* * * * *